United States Patent
Kaga et al.

(10) Patent No.: US 10,763,821 B2
(45) Date of Patent: Sep. 1, 2020

(54) CRYSTAL RESONATOR

(71) Applicant: NIHON DEMPA KOGYO CO., LTD., Tokyo (JP)

(72) Inventors: Shigetaka Kaga, Saitama (JP); Yoshiro Teshima, Saitama (JP); Kazuhiro Hirota, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 334 days.

(21) Appl. No.: 15/681,440

(22) Filed: Aug. 21, 2017

(65) Prior Publication Data
US 2018/0054181 A1   Feb. 22, 2018

(30) Foreign Application Priority Data

Aug. 22, 2016  (JP) ................................. 2016-161762
Feb. 3, 2017   (JP) ................................. 2017-018070

(51) Int. Cl.
| H03H 3/02 | (2006.01) |
| H03H 9/19 | (2006.01) |
| H03H 9/13 | (2006.01) |
| H03H 9/05 | (2006.01) |
| H03H 3/04 | (2006.01) |

(52) U.S. Cl.
CPC .............. *H03H 9/132* (2013.01); *H03H 3/02* (2013.01); *H03H 9/0514* (2013.01); *H03H 9/0528* (2013.01); *H03H 9/19* (2013.01); H03H 2003/0428 (2013.01)

(58) Field of Classification Search
CPC ................................ H01L 41/08; H03H 9/132
See application file for complete search history.

(56) References Cited

U.S. PATENT DOCUMENTS

| 5,903,087 A | 5/1999 | Mattson et al. | |
| 6,114,801 A * | 9/2000 | Tanaka ..................... | H03H 3/04 |
| | | | 310/312 |
| 10,277,197 B2 * | 4/2019 | Kaga ....................... | H03H 9/19 |
| 2012/0200198 A1 | 8/2012 | Yamamoto | |
| 2013/0027141 A1 | 1/2013 | Koyama et al. | |
| 2017/0187349 A1 * | 6/2017 | Sato ........................ | H03H 9/19 |

FOREIGN PATENT DOCUMENTS

| JP | 2014042084 | 3/2014 |
| TW | 201312939 | 3/2013 |
| TW | I523285 | 2/2016 |
| WO | 9847226 | 10/1998 |

OTHER PUBLICATIONS

"Office Action of Taiwan Counterpart Application", dated Mar. 31, 2020, with English translation thereof, pp. 1-7.

* cited by examiner

*Primary Examiner* — Thomas M Dougherty
*Assistant Examiner* — Karen B Addison
(74) *Attorney, Agent, or Firm* — JCIPRNET

(57) ABSTRACT

A crystal resonator vibrates in a thickness-shear mode. The crystal resonator includes excitation electrodes being disposed on a front surface and a back surface of a crystal element. The excitation electrodes are disposed on the crystal element to have a positional relationship, where a displacement distribution at an edge of the excitation electrode on the front surface is identical to a displacement distribution at an edge of the excitation electrode on the back surface.

21 Claims, 27 Drawing Sheets

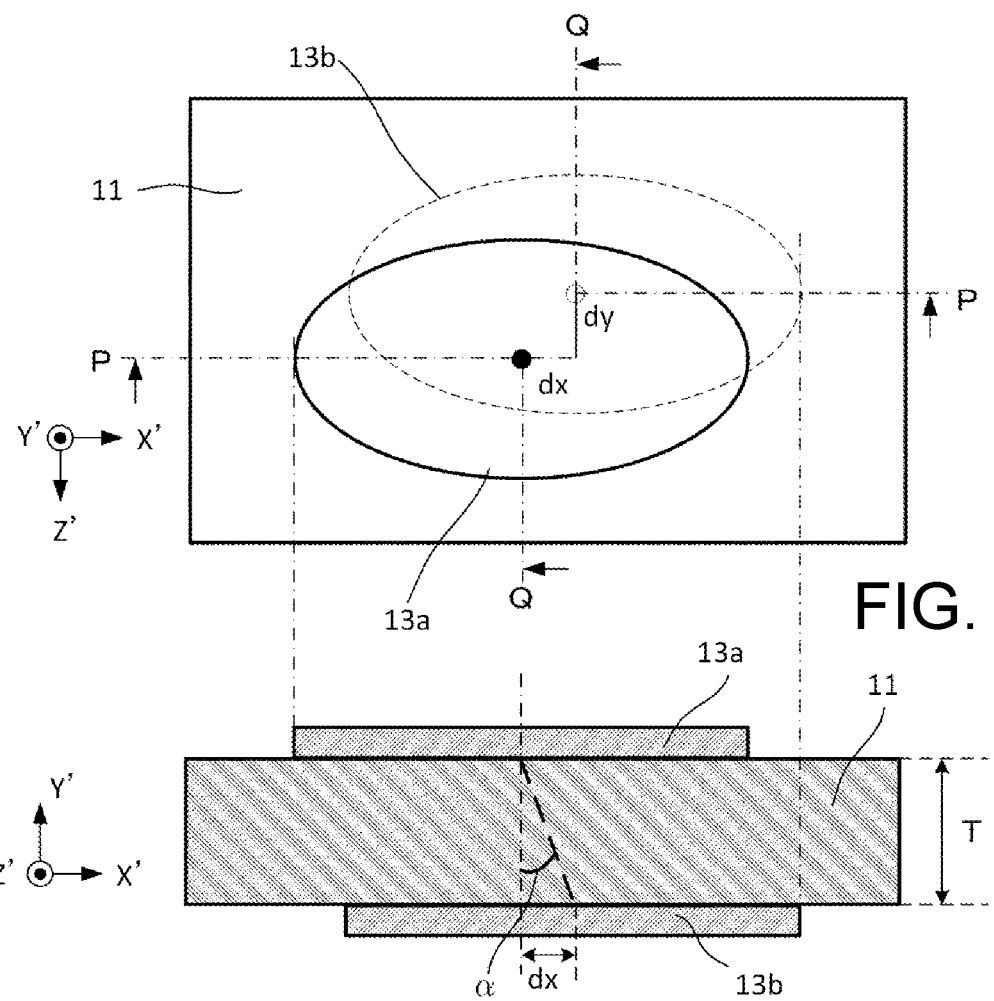
FIG. 1A
FIG. 1B
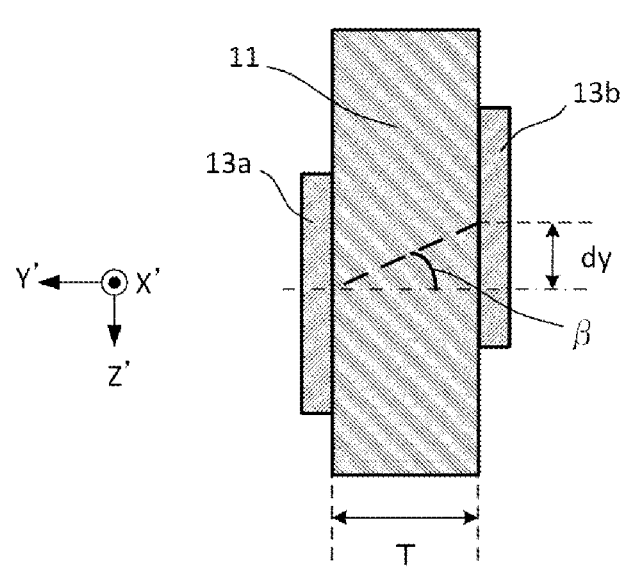
FIG. 1C

CRYSTAL RESONATOR

CROSS-REFERENCE TO RELATED APPLICATIONS

This application is based on and claims priority under 35 U.S.C. § 119 to Japanese Patent Application Nos. 2016-161762, filed on Aug. 22, 2016, and Japanese Patent Application Nos. 2017-018070, filed on Feb. 3, 2017, the entire contents of which are incorporated herein by reference.

TECHNICAL FIELD

This disclosure relates to a crystal resonator vibrating in a thickness-shear mode.

DESCRIPTION OF THE RELATED ART

There has been known an AT-cut crystal resonator and a so-called doubly-rotated crystal resonator typified by an SC-cut crystal resonator, as a crystal resonator vibrating in a thickness-shear mode. These crystal resonators are electronic components necessary for an advanced information and communications society; therefore, efforts to improve the properties have been made from various aspects.

As one method to improve the properties, there is a method focusing on excitation electrodes disposed on both surfaces of a crystal element. For example, WO98/47226 discloses a structure that relatively displaces excitation electrodes, which are disposed on both principle surfaces of an AT-cut crystal element, by a predetermined amount in an X-axis direction of the crystal, so as to control frequency/temperature characteristics. Japanese Unexamined Patent Application Publication No. 2014-42084 discloses a crystal resonator with an SMD structure that supports one end of an AT-cut crystal element with a conductive adhesive. The crystal resonator has a structure that displaces an excitation electrode on a lower surface side, among excitation electrodes disposed on front and back surfaces of the crystal element, to a position far from the conductive adhesive with respect to an excitation electrode on a top surface side, so as to reduce an influence from the conductive adhesive.

A need thus exists for a crystal resonator which is not susceptible to the drawback mentioned above.

SUMMARY

This disclosure provides a crystal resonator that vibrates in a thickness-shear mode. The crystal resonator includes excitation electrodes being disposed on a front surface and a back surface of a crystal element. The excitation electrodes are disposed on the crystal element to have a positional relationship, where a displacement distribution at an edge of the excitation electrode on the front surface is identical to a displacement distribution at an edge of the excitation electrode on the back surface.

BRIEF DESCRIPTION OF THE DRAWINGS

The foregoing and additional features and characteristics of this disclosure will become more apparent from the following detailed description considered with reference to the accompanying drawings, wherein FIG. 1A, FIG. 1B, and FIG. 1C are drawings describing a configuration of a crystal resonator according to a first embodiment.

DETAILED DESCRIPTION

Figure 2:
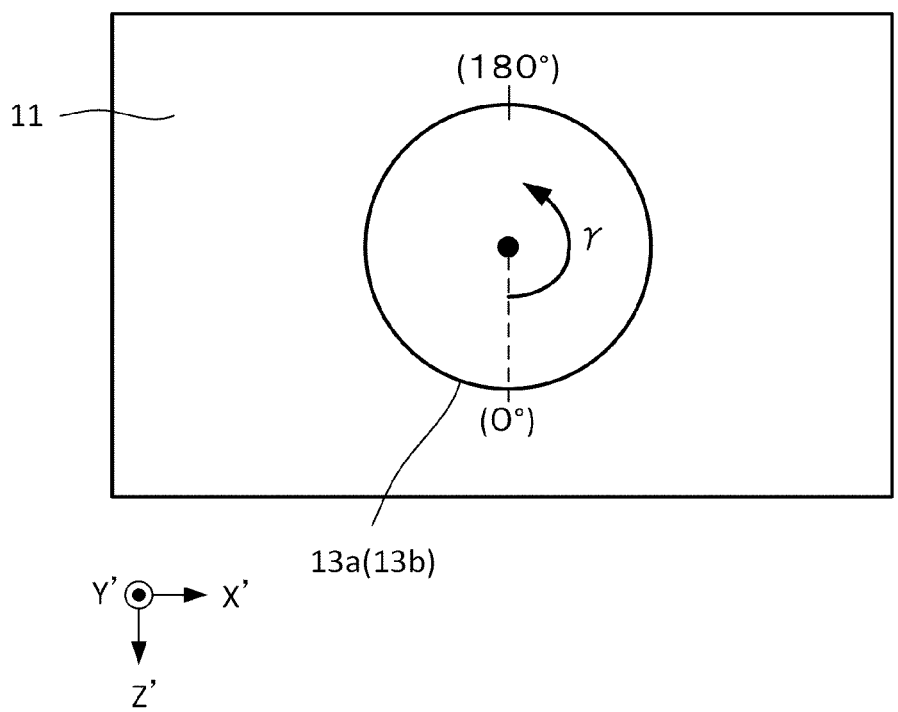
FIG. 2 is a drawing describing a simulation condition for the crystal resonator according to the first embodiment.
Figure 3A:
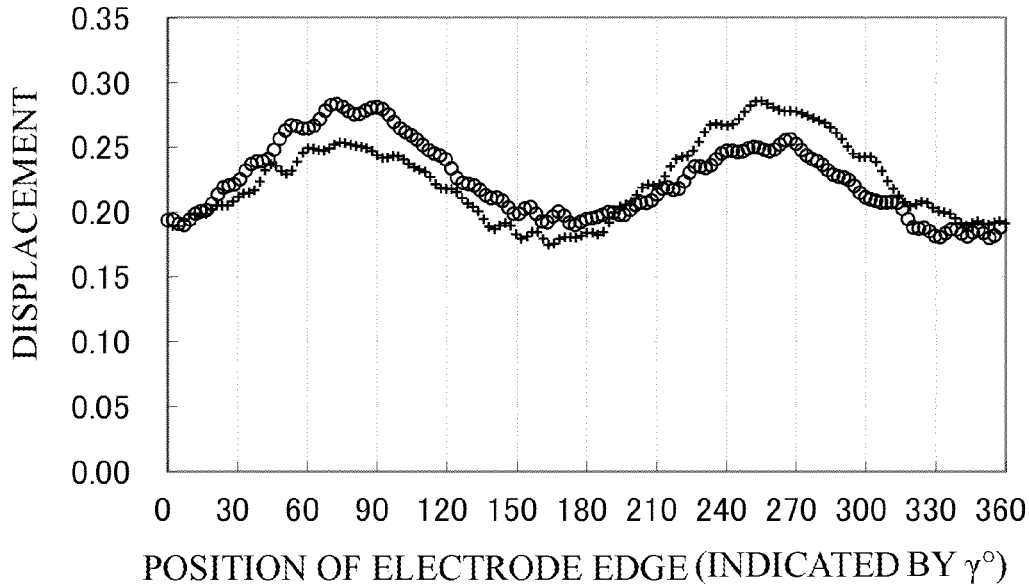
FIG. 3A and FIG. 3B are drawings describing simulation results of the crystal resonator according to the first embodiment.
Figure 3B:
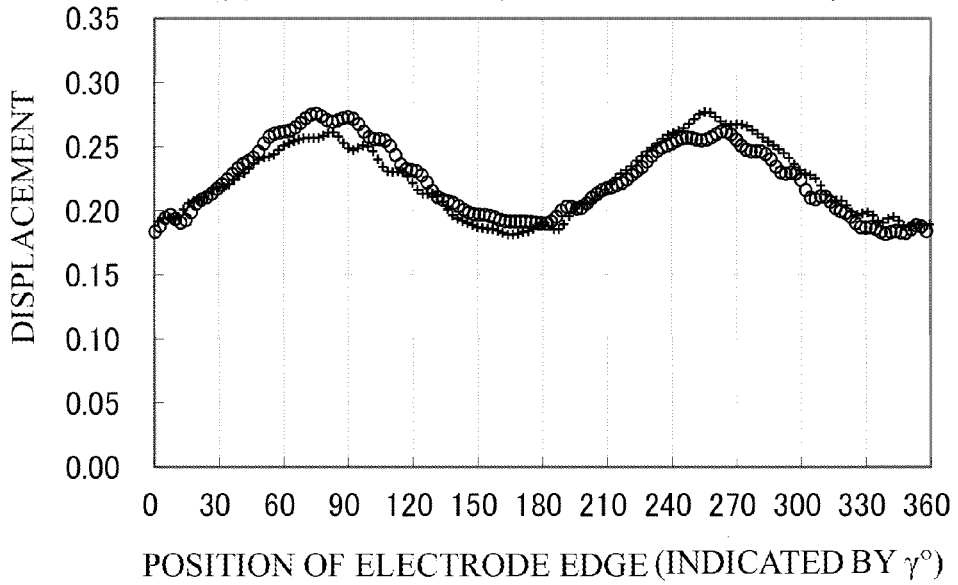
Figure 4A:
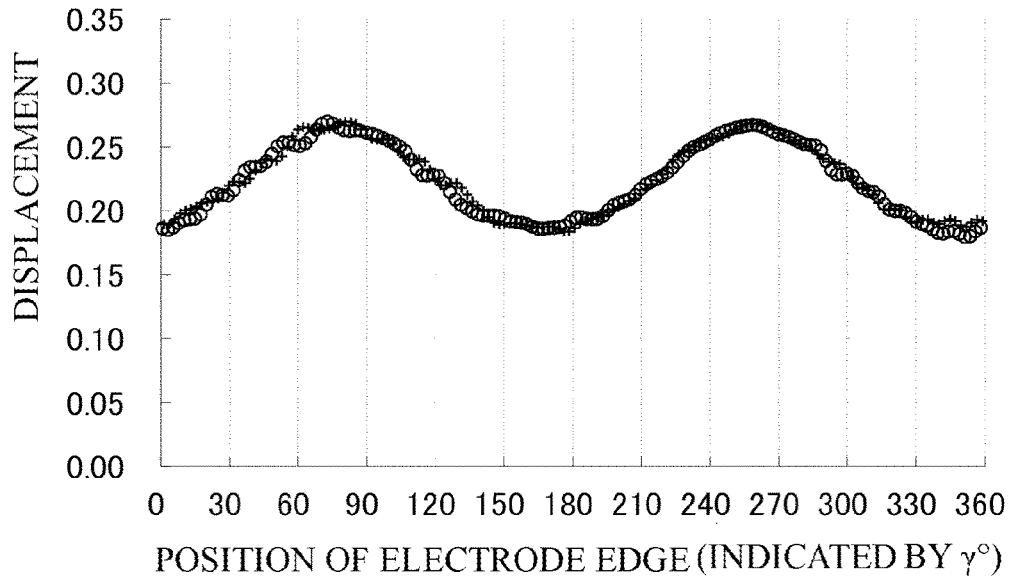
FIG. 4A and FIG. 4B are drawings describing the simulation results of the crystal resonator according to the first embodiment continuous with FIG. 3B.
Figure 4B:
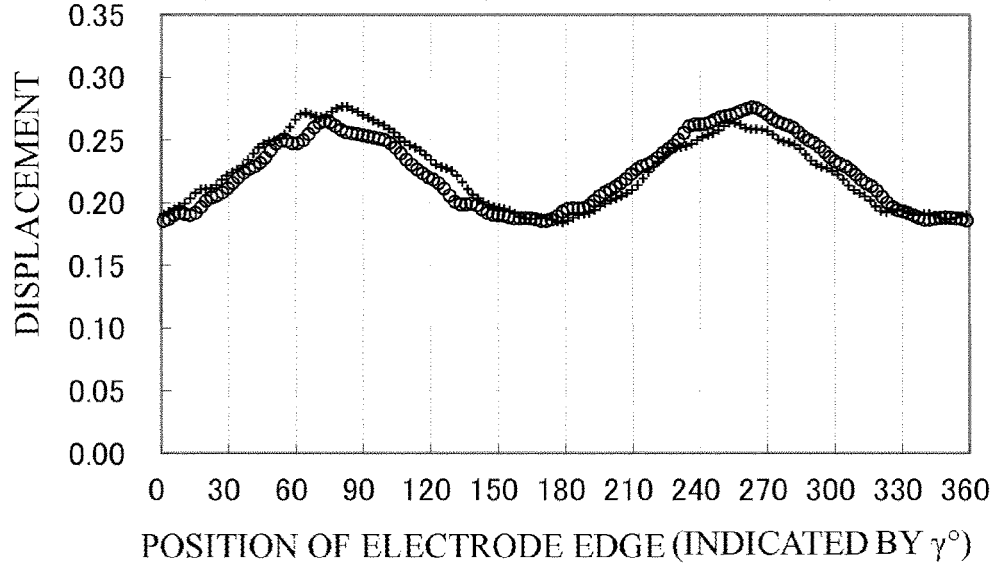
Figure 5A:
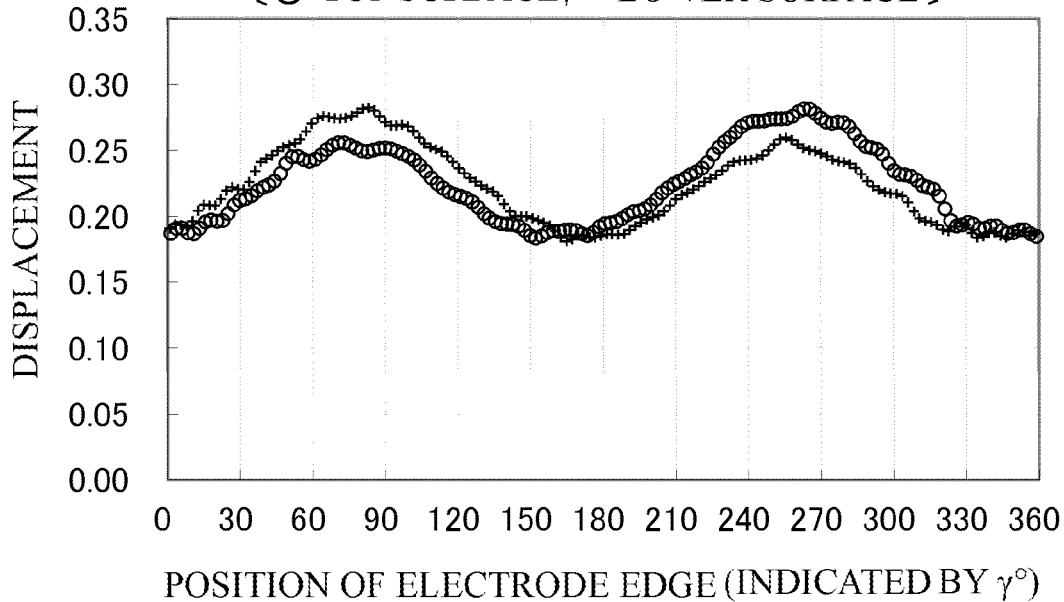
FIG. 5A and FIG. 5B are drawings describing the simulation results of the crystal resonator according to the first embodiment continuous with FIG. 4B.
Figure 5B:
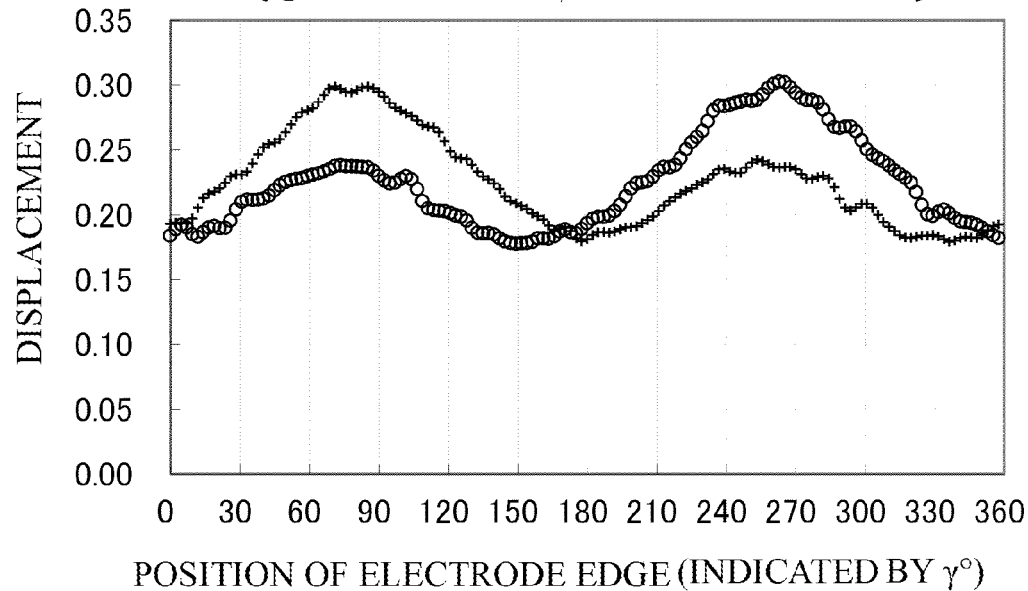

The following describes embodiments of a crystal resonator according to this disclosure with reference to the drawings. Each drawing used in the description is merely illustrated schematically for understanding this disclosure. In each drawing used in the description, like reference numerals designate corresponding or identical elements, and therefore such elements may not be further elaborated here. Shapes, dimensions, materials, and a similar factor described in the following explanations are merely preferable examples within the scope of this disclosure. Therefore, this disclosure is not limited to only the following embodiments.

1. First Embodiment

1-1. Structure of Crystal Resonator According to First Embodiment

FIG. 1A to FIG. 1C are explanatory drawings especially focusing on a crystal element 11 of the crystal resonator according to the first embodiment. In detail, FIG. 1A is a plan view of the crystal element 11, FIG. 1B is a cross-sectional view of the crystal element 11 taken along a line P-P in FIG. 1A, and FIG. 1C is a cross-sectional view of the crystal element 11 taken along a line Q-Q in FIG. 1A.

The crystal resonator according to the first embodiment includes the crystal element 11 and excitation electrodes 13a and 13b, which are disposed on front and back surfaces of the crystal element 11. These excitation electrodes 13a and 13b are disposed on the front and back surfaces (i.e., principle surfaces) of the crystal element 11 with a positional relationship, such that a displacement distribution at an edge of the excitation electrode 13a on one surface (i.e., the front surface) of principle surfaces of the crystal element 11 is identical to a displacement distribution at an edge of the excitation electrode 13b on the other surface (i.e., the back surface) of principle surfaces of the crystal element 11.

The crystal element 11 is various crystal elements vibrating in a thickness-shear mode. Specifically, the crystal element 11 can be an AT-cut crystal element, an SC-cut crystal element which is referred to as so-called doubly-rotated crystal resonator, an M-SC-cut crystal element, and an IT-cut crystal element. For example, detailed simulations in the following description are performed using the M-SC-cut crystal element. The M-SC-cut is a crystal element cut out by rotating a crystal bar at a predetermined angle φ in a range of 24°±1° with a Z-axis of the crystal as a rotation axis and further rotating the crystal bar at a predetermined angle θ in a range of 34°±1° with an X'-axis generated here as the rotation axis. Therefore, this crystal element 11 is one kind of the crystal element having a thickness in a Y'-axis direction of the crystal and a principle surface on an X'-Z'-surface of the crystal.

The following describes a specific configuration of the excitation electrodes 13a and 13b. The excitation electrodes 13a and 13b have the identical planar shape and the identical size. Apparently, "the planar shape is identical" and "the size is identical" may mean substantially identical. A slight difference caused by, for example, fabrication accuracy is acceptable. Defining the excitation electrode disposed on a positive Y'-surface of the crystal element 11 as the first excitation electrode 13a and the excitation electrode disposed on a negative Y'-surface of the crystal element 11 as the second excitation electrode 13b, the second excitation electrode 13b is disposed at a position meeting the following relationships of (1), (2), and (3) with respect to the first excitation electrode 13a. T in the following formulas indicates a thickness of the crystal element. Angles α and β are predetermined angles, which will be described later.

(1) The first excitation electrode 13a is moved along the X'-axis of the crystal by a distance dx given by T● tan α in the positive X'-direction (see FIG. 1B).

(2) The first excitation electrode 13a is moved along the Z'-axis of the crystal by a distance dy given by T● tan β in the negative Z'-direction (see FIG. 1C).

(3) Then, the second excitation electrode 13b is disposed at a position where the state moved in (1) and (2) is projected on the negative Y'-surface (see FIG. 1A).

Accordingly, as illustrated in FIG. 1A, the second excitation electrode 13b viewed from the first excitation electrode 13a is disposed at the position displaced from the first excitation electrode 13a by the predetermined distance in the positive X'-direction and the negative Z'-direction on the back surface of the crystal element 11.

Simulations based on a finite element method by the inventor of this application have proved the following. Designing the angles α and β shown in the above-described formulas (1) and (2) to be predetermined angles allows the first and the second excitation electrodes to be disposed in a positional relationship, where a displacement distribution at an edge of the first excitation electrode 13a is identical to a displacement distribution at an edge of the second excitation electrode 13b. Moreover, it has proved that values appropriate for the angles α and β are present depending on the cut type of the crystal element or depending on a used mode of vibration. Table 1 shows the results.

[Table 1]

TABLE 1

Crystal Elements and Predetermined Angles α and β for each Mode of Vibration of Crystal Elements Preferable by Application of This Disclosure

| Type of crystal element | Cut angle | | Predetermined angles α and β (C mode) | | Predetermined angles α and β (B mode) | |
|---|---|---|---|---|---|---|
| | Around Z-axis φ° | Around X-axis θ° | α° | β° | α° | β° |
| SC-cut | 22 ± 1 | 34 ± 1 | 25 ± 5 | 1 ± 5 | −6 ± 5 | −16 ± 5 |
| M-SC-cut | 24 ± 1 | 34 ± 1 | 25 ± 5 | 0 ± 5 | −6 ± 5 | −17 ± 5 |
| IT-cut | 19 ± 1 | 34 ± 1 | 24 ± 5 | 2 ± 5 | −7 ± 5 | −14 ± 5 |
| AT-cut | 0 | 35 ± 1 | 0 ± 5 | 4 ± 5 | | |

1-2. Examination Examples of Angles α and β of First Embodiment

Table 1 shows the predetermined angles α and β and their allowable ranges. Therefore, the following describes simulation examples regarding advantages brought by the angles α and β being the predetermined ranges. It is known that, since the crystal is an anisotropic material, the crystal resonator vibrating in the thickness-shear mode has different directions between a direction of a phase velocity of elastic wave in a medium and a direction of an energy velocity (power flow direction). Therefore, it is thought that vibration displacements on the front and the back surfaces of the crystal element when the crystal resonator vibrates do not become the identical position at the front and the back surfaces. The inventor of this application thought that, it is not preferable to cause the excitation electrodes with the identical shape and the identical size to be right opposed on the front and the back surfaces of the crystal element in such state.

Therefore, as illustrated in FIG. 2, as a simulation model by the finite element method, the model that includes the first and the second excitation electrodes 13a and 13b with the identical planar shape and the identical size on the front and the back surfaces of the crystal element 11 was configured. Furthermore, the vibration displacements at edge positions on the respective first and second excitation electrodes 13a and 13b, that is, the respective sites along the edges of the excitation electrodes were calculated by the finite element method. Furthermore, the vibration displacements in the case where the position of the second excitation electrode 13b is displaced from the first excitation electrode 13a were each calculated. As illustrated in FIG. 2, the respective edges on the excitation electrodes were positioned at edges specified by an angle γ, namely, the position at 0°, . . . , the position at 180°, . . . , and so on.

FIG. 3A to FIG. 5B illustrate the displacement distributions obtained by the above-described simulations. Note that, these drawings illustrate the simulation results of vibrating the M-SC-cut crystal element as the crystal element in a C mode. FIG. 3A to FIG. 5B indicate the position of the edge on the excitation electrode specified by the above-described angle γ on the horizontal axis and the displacement when the crystal element model vibrates on the vertical axis. The displacement is indicated by a value normalized by a maximum displacement. In FIG. 3A to FIG. 5B, the characteristic diagrams plotted by ○ are the displacement distributions of the edges on the first excitation electrode 13a, and the characteristic diagrams plotted by + are the displacement distributions of the edges on the second excitation electrode 13b. Note that, the execution results of the various simulations by the inventor have proved that the angle β in the M-SC-cut is preferably close to 0.2°. FIG. 3A to FIG. 5B show the results of the displacement distributions of the edges on the first and the second excitation electrodes in the case where the angle α is differentiated to 35°, 30°, 25°, 20°, 15°, and 0° with the condition of the angle β fixed to 0.2°.

Figure 6:
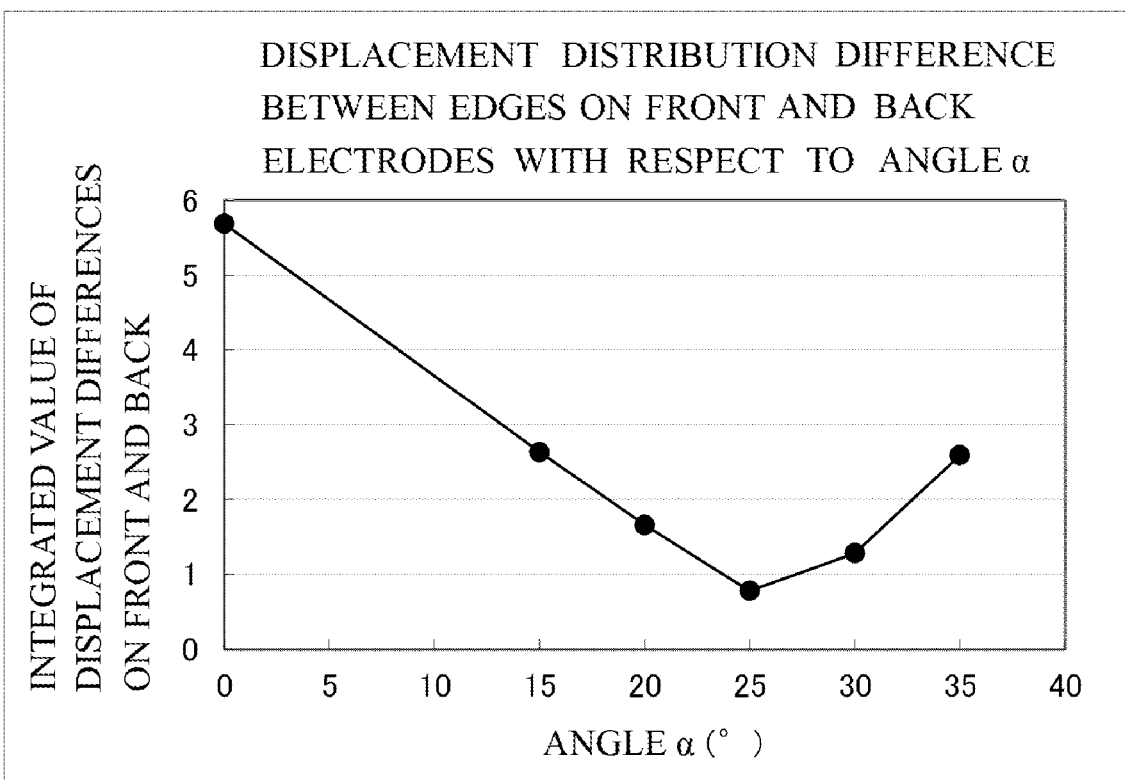
FIG. 6 is a drawing illustrating a gist of the simulation results of the crystal resonator according to the first embodiment.

FIG. 6 is a drawing summarizing the gist of the results of FIG. 3A and FIG. 3B, FIG. 4A and FIG. 4B, and FIG. 5A and FIG. 5B. Specifically, FIG. 6 shows differences between the displacement distributions at the edge on the first excitation electrode and the displacement distributions at the edge on the second excitation electrode in the above-described six kinds of respective simulations differentiating the angle α by integrated values found by integrating the differences in displacement at the identical edge position across the entire edge. This indicates that, the smaller this integrated value is, a degree of match of the displacement distributions at the edges on the excitation electrodes on the front and the back surfaces is high.

As apparent through the comparisons of FIG. 3A to FIG. 5B and FIG. 6, it is seen that changing the angle α changes the displacement distribution at the edge on the first excitation electrode 13a and the displacement distribution at the edge on the second excitation electrode 13b. It is seen that the displacement distribution at the edge on the first excitation electrode 13a matches the displacement distribution at the edge on the second excitation electrode 13b most with the angle α=25° (see FIG. 4A). Many simulation results conducted by the inventor including this simulation have found that, with the M-SC-cut and in the C mode, the displacement distributions at the edges on the first and the second excitation electrodes match most at the proximity of the angle α=25° and at the proximity of the angle β=0.2°. Moreover, especially, as apparent from FIG. 6, taking an effect of improvement in property of a crystal resonator into consideration, it is seen that the angle α is preferably −20 to −30°, namely, α=25±5° and is further preferably α=25±3°. It is seen that β is preferably β=0±5° and further preferably β=0±3°. Similar simulation results have found that, with the M-SC-cut and in a B mode, the angle α and the angle β are preferably α=−6±5° and β=−17±5° and further preferably α=−6±3° and β=−6±3°.

Simulations were conducted on other SC-cut, IT-cut, and AT-cut crystal elements similar to the above-described simulations. Values preferable for the angle α and the angle β of these crystal elements were calculated. The following Table 2 shows the preferable results together with the above-described M-SC-cut results.

[Table 2]

TABLE 2

Simulation Conditions and Examples of Predetermined Angles α and β Found through Simulations

| Type of crystal element | Cut angle condition at simulation | | Predetermined angles α and β (C mode) | | Predetermined angles α and β (B mode) | |
|---|---|---|---|---|---|---|
| | Around Z-axis φ° | Around X-axis θ° | α° | β° | α° | β° |
| SC-cut | 22.5 | 34 | 25.2 | 1.1 | −6 | −16.1 |
| M-SC-cut | 24.2 | 33.9 | 25.5 | 0.2 | −5.7 | −16.9 |
| IT-cut | 18.9 | 34.4 | 23.9 | 2.4 | −7.2 | −14 |
| AT-cut | 0 | 35.2 | 0.1 | 4.2 | | |

Moreover, as shown in the above-described Table 1, from the simulation results, it has been proved that the allowable ranges of the angle α and the angle β for the respective SC-cut, IT-cut, and AT-cut are each preferably the predetermined value ±5°, and more preferably the predetermined value ±3°.

2. Second Embodiment

The first embodiment displaces the excitation electrodes on the front and the back surfaces by the predetermined positional relationship shown in the above-described (1) to (3). This allowed the displacement distributions at the edges on the excitation electrodes on the front and the back surfaces to be identical to or close to one another. Further examination by the inventor has proved that the following is preferable. The excitation electrodes on the front and the back surfaces are displaced by the predetermined positional relationship, the planar shapes of the excitation electrodes are formed into an elliptical shape, ellipse ratios of the ellipse electrodes are configured to be in a predetermined range according to the cut type of the crystal elements, and the ellipse electrodes are disposed by rotated in-plane with respect to the crystal element in the predetermined range. Although the details will be described later, it has been proved that doing so causes the displacements at the edges on the excitation electrodes are likely to be an identical or close value at the respective sites of the edge. That is, it has been proved that this causes the displacement distribution at the edge on the excitation electrode to be likely to be flat. The second embodiment is the example of this structure.

Figure 7A:
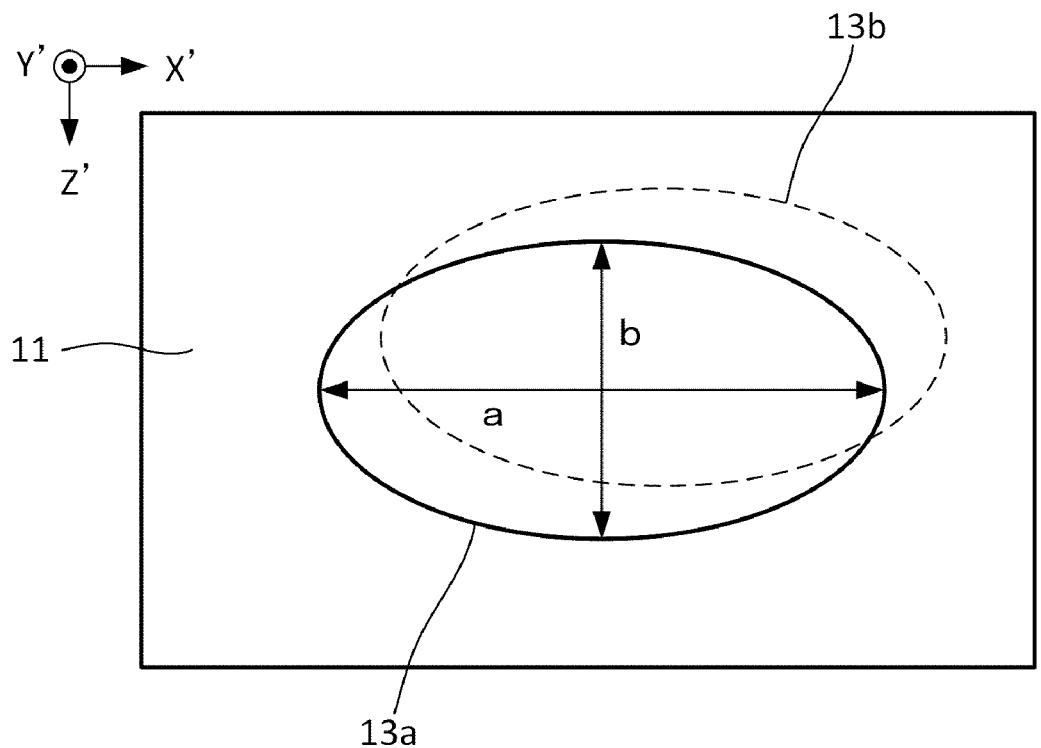
FIG. 7A and FIG. 7B are drawings describing a configuration of a crystal resonator according to a second embodiment.
Figure 7B:
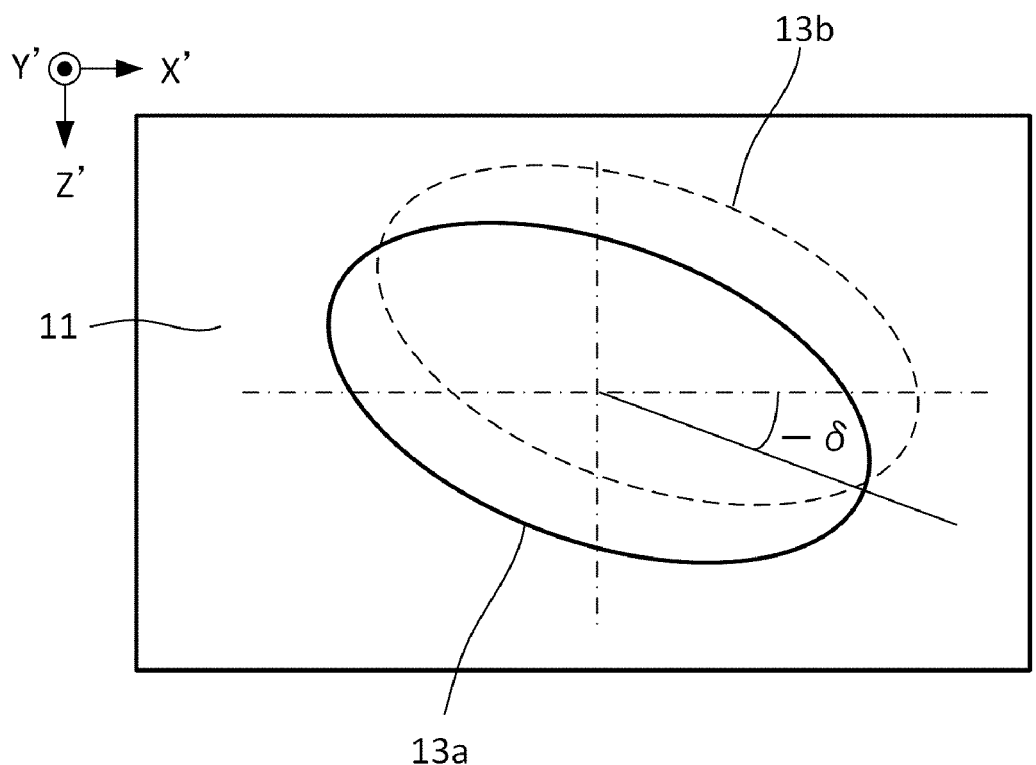
Figure 8A:
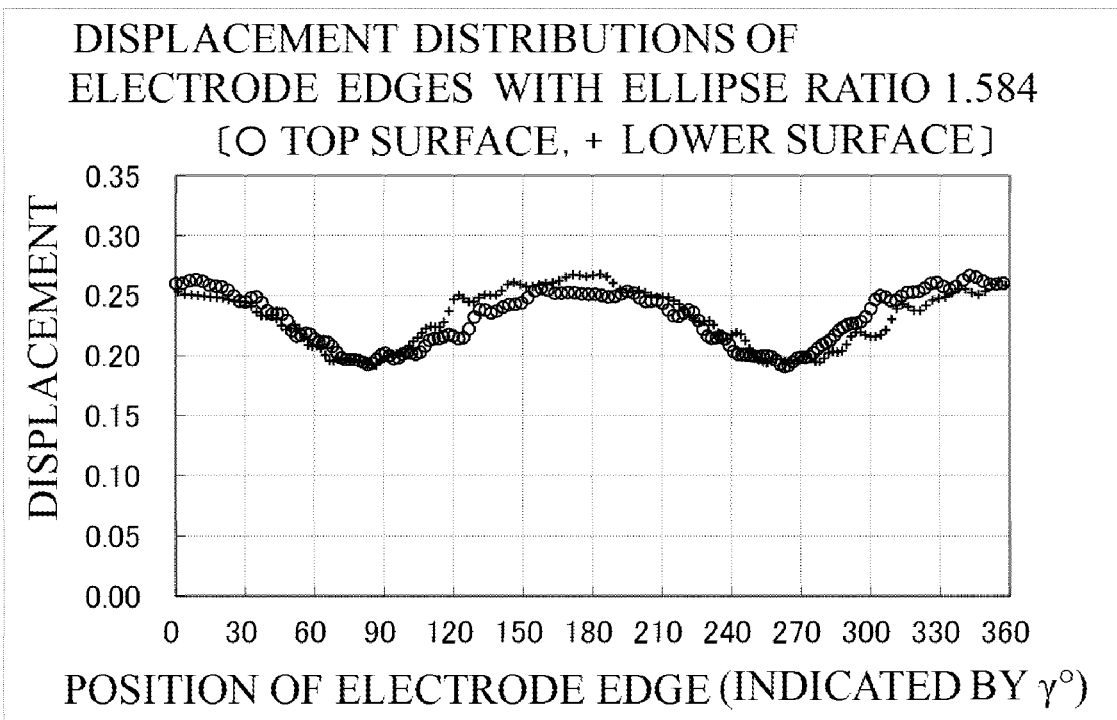
FIG. 8A, FIG. 8B, and FIG. 8C are drawings describing simulation results of an ellipse ratio of an ellipse electrode.
Figure 8B:
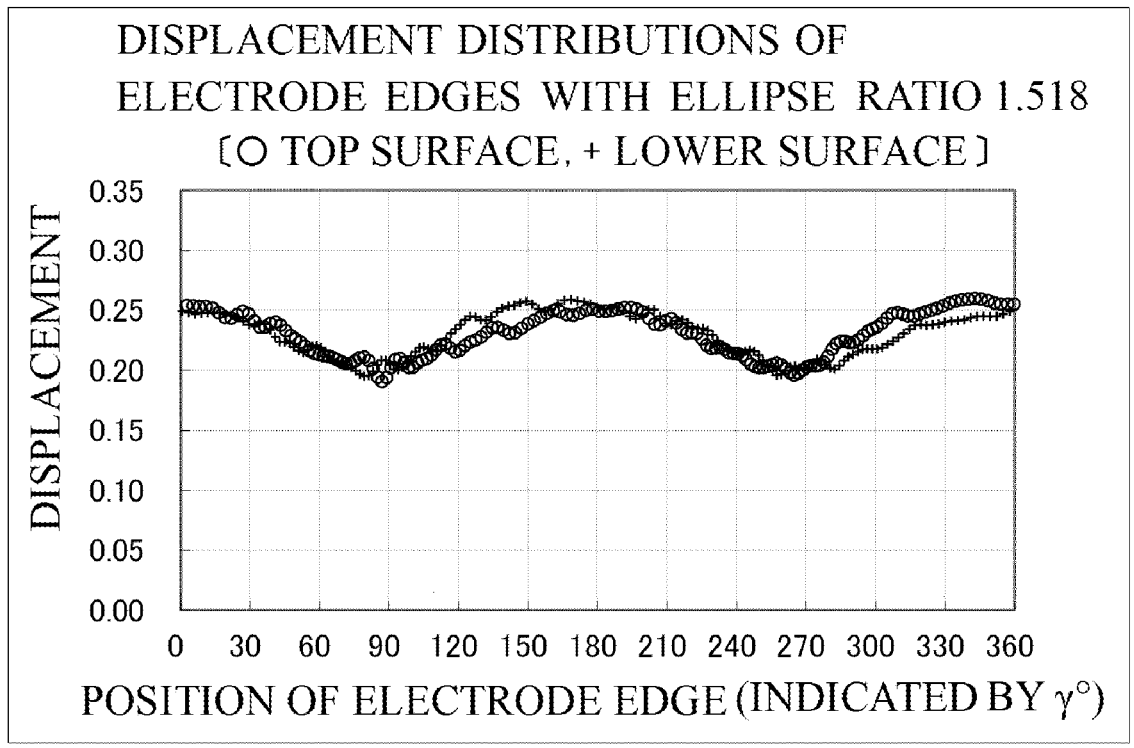
Figure 8C:
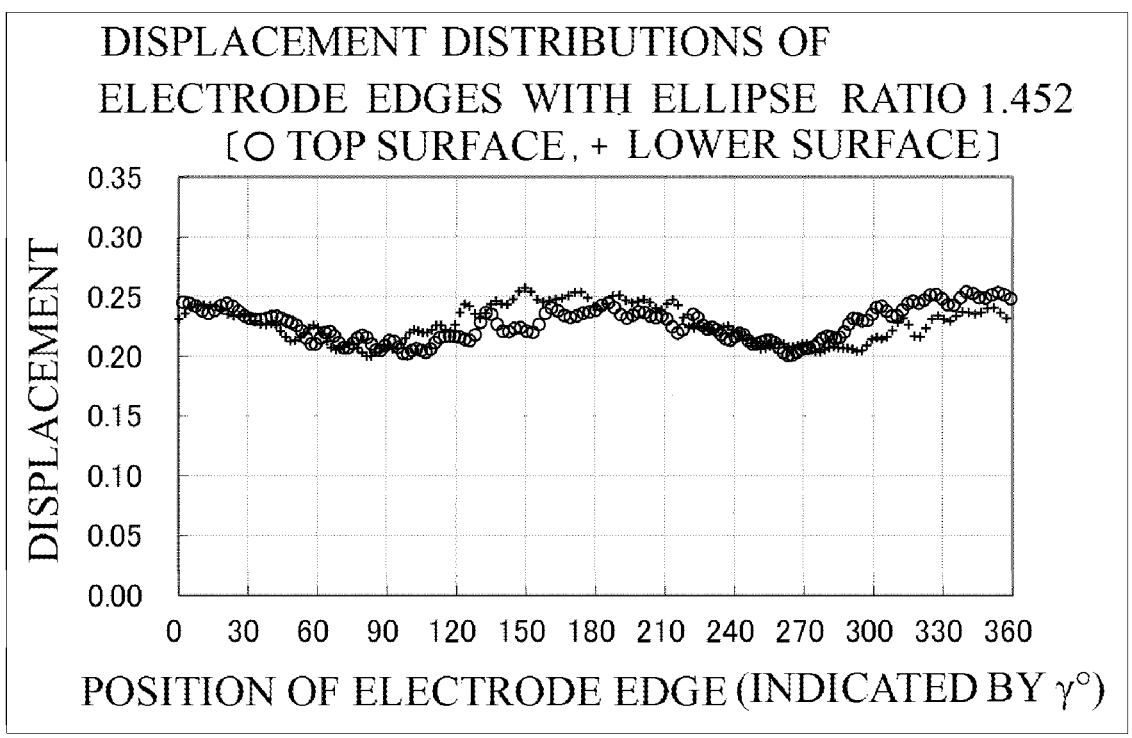
Figure 9A:
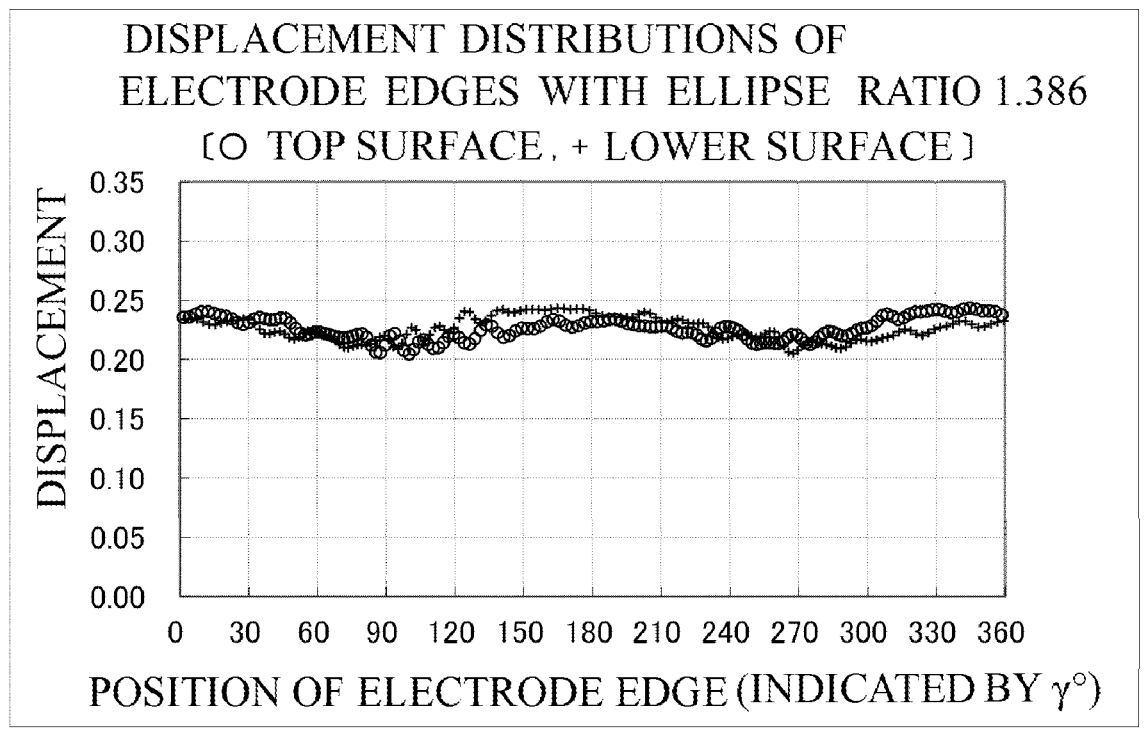
FIG. 9A, FIG. 9B, and FIG. 9C are drawings describing the simulation results of the ellipse ratio of the ellipse electrode continuous with FIG. 8C.
Figure 9B:
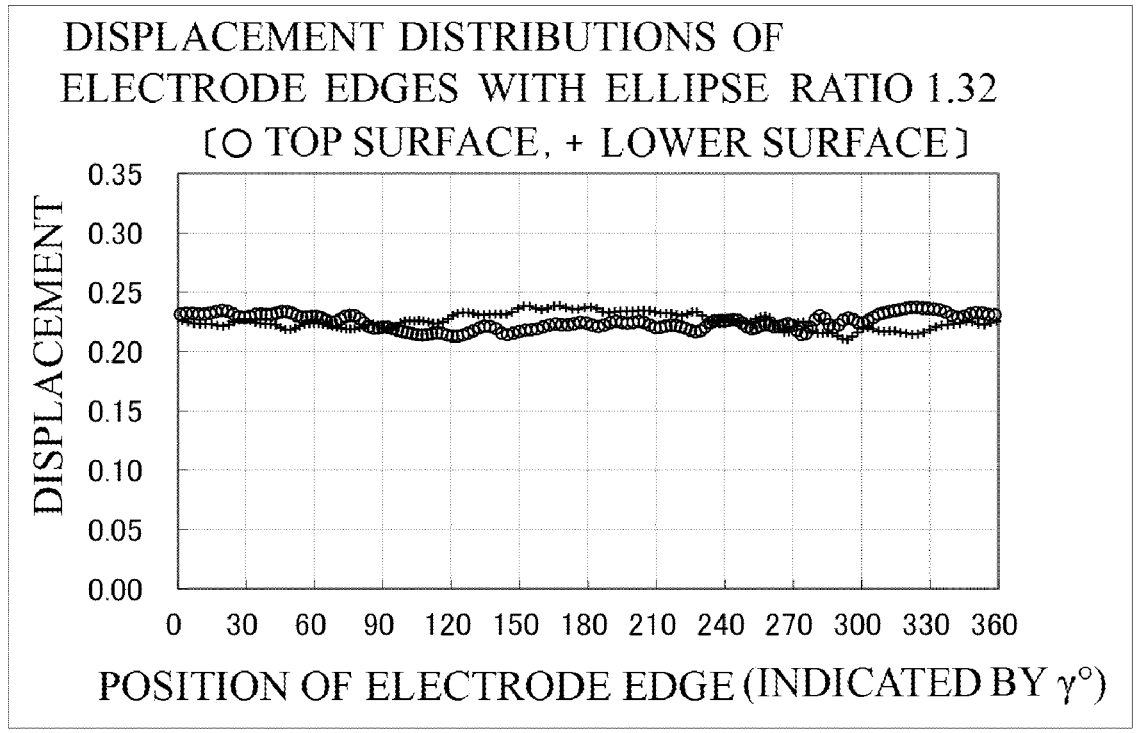
Figure 9C:
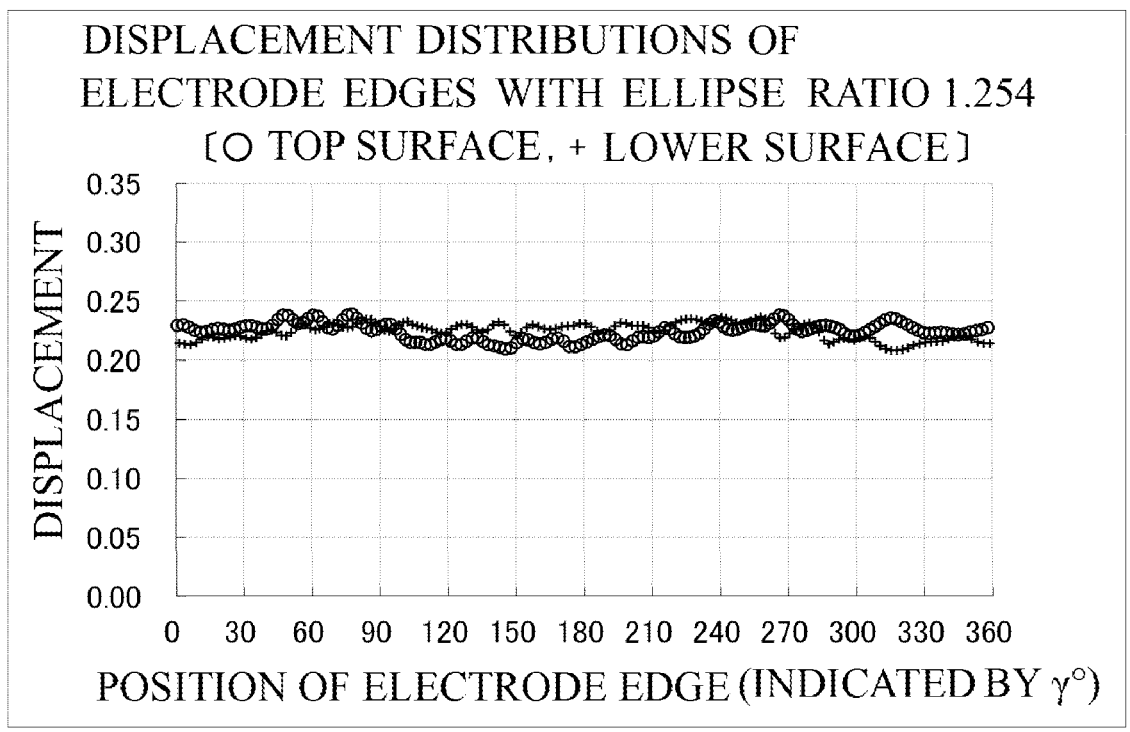
Figure 10A:
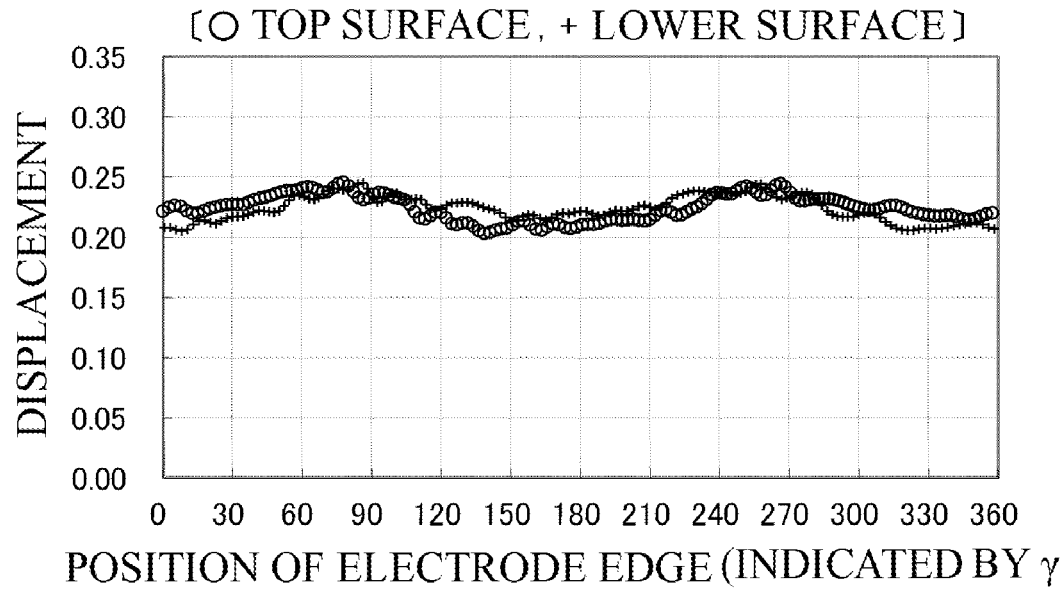
FIG. 10A, FIG. 10B, and FIG. 10C are drawings describing the simulation results of the ellipse ratio of the ellipse electrode continuous with FIG. 9C.
Figure 10B:
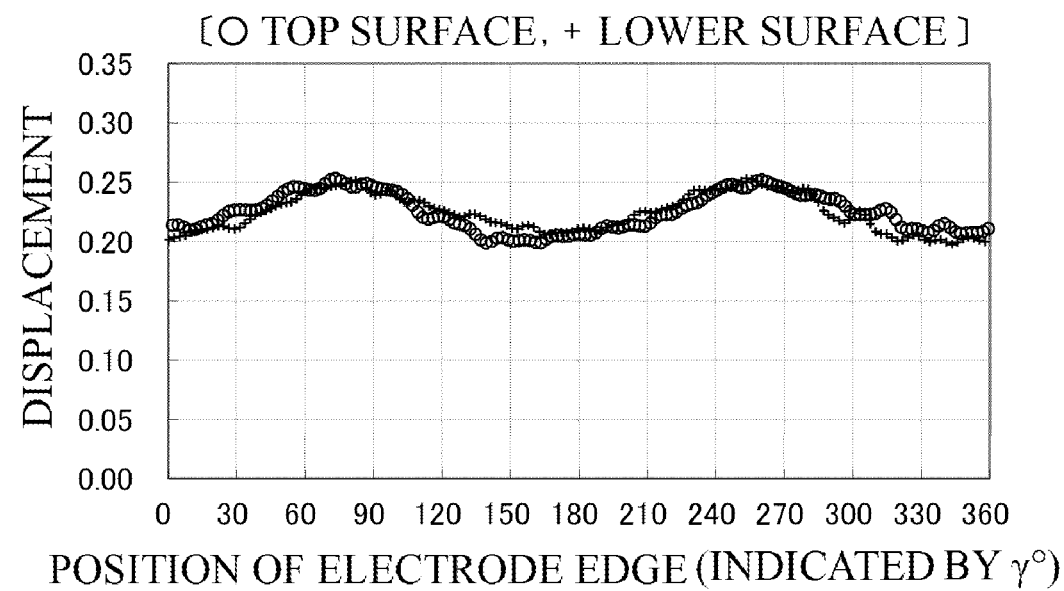
Figure 10C:
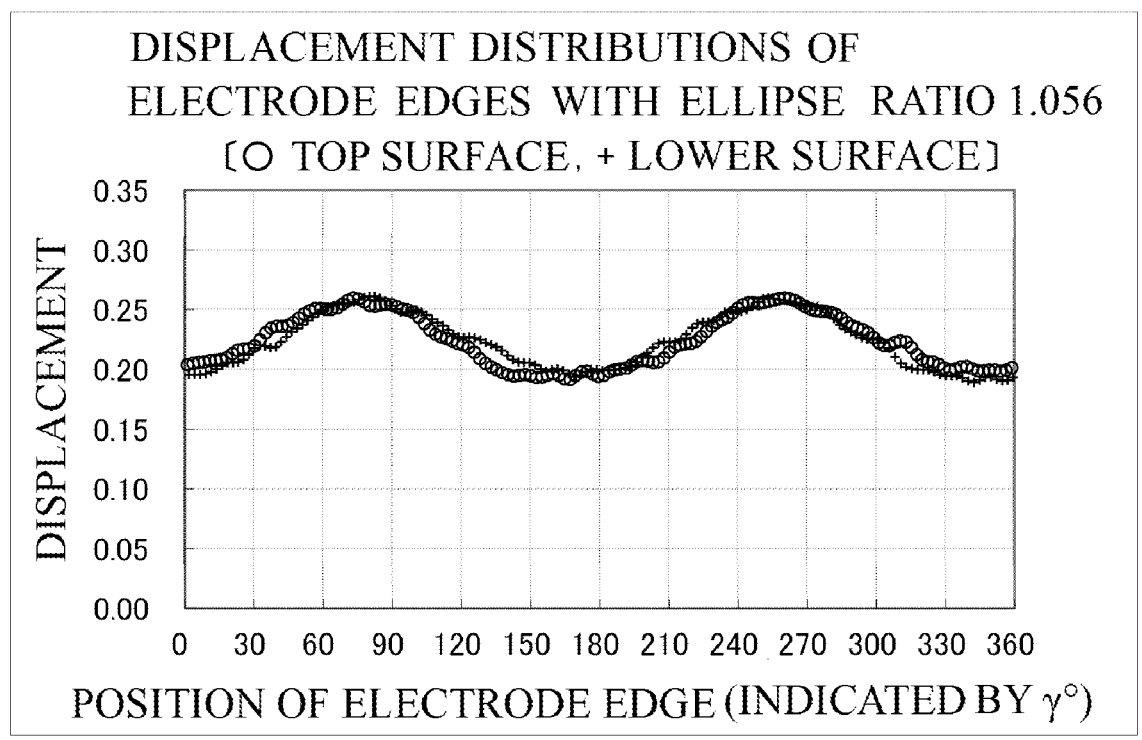

FIG. 7A and FIG. 7B are explanatory drawings of the second embodiment. The crystal resonator according to this second embodiment includes the first excitation electrode 13a and the second excitation electrode 13b disposed on the crystal element 11, each have the elliptical planar shape and a predetermined ellipse ratio. Additionally, the first excitation electrode 13a and the second excitation electrode 13b are rotated in-plane in predetermined angle ranges with respect to the crystal element and are displaced by the predetermined relationships (1) to (3) similar to the first embodiment.

Here, the ellipse ratio and the in-plane rotation angle are defined as follows. A dimension of the elliptical excitation electrode along the X′-axis of the crystal element is defined as a, and a dimension along the Z′-axis as b (FIG. 7A), and the ellipse ratio is defined as a/b. The in-plane rotation angle of the elliptical excitation electrode with respect to the crystal element is defined as an angle δ with respect to the X'-axis of the crystal element (FIG. 7B). Note that, as illustrated in FIG. 7B, this angle δ uses the Y'-axis as a rotation axis on the positive Y'-surface. The counterclockwise rotation is defined as positive and the clockwise rotation as negative.

The models variously changing the thus defined ellipse ratio a/b and in-plane rotation angle δ were configured to examine the displacement distributions at the edges on the first and the second excitation electrodes 13a and 13b using the finite element method as follows.

2-1. Examination of Ellipse Ratio

First, the preferable range of the ellipse ratio of the excitation electrode was examined as follows. The simulations employed the M-SC-cut crystal element, a fundamental wave mode in the C mode as the mode of vibration, α=25.5° and β=0.2° as the angles α and β, which determine the positional relationship between the first excitation electrode 13a and the second excitation electrode 13b, and α=−9° as the in-plane rotation angle δ of the excitation electrodes with respect to the crystal element; and variously changed the ellipse ratio. The simulated ellipse ratios are 1.584, 1.518, 1.452, 1.386, 1.32, 1.254, 1.188, 1.122, and 1.056. Considering the ellipse ratio 1.32 as the reference, the ellipse ratios correspond to 20%-increase, 15%-increase, 10%-increase, 5%-increase, 5%-reduction, 10%-reduction, 15%-reduction, and 20%-reduction, respectively.

FIG. 8A to FIG. 8C, FIG. 9A to FIG. 9C, and FIG. 10A to FIG. 10C illustrate the displacement distributions at the edges on the excitation electrodes obtained by the simulations with the above-described ellipse ratios. FIG. 8A to FIG. 10C show the edge positions on the excitation electrodes specified by the angle γ similar to the first embodiment on the horizontal axis and the displacements when the crystal element model vibrates on the vertical axis. The displacement is indicated by the value normalized by the maximum displacement similar to the first embodiment. In FIG. 8A to FIG. 10C, the characteristic diagrams plotted by ○ are the displacement distributions of the edges on the first excitation electrode 13a and the characteristic diagrams plotted by + are the displacement distributions of the edges on the second excitation electrode 13b.

Figure 11:
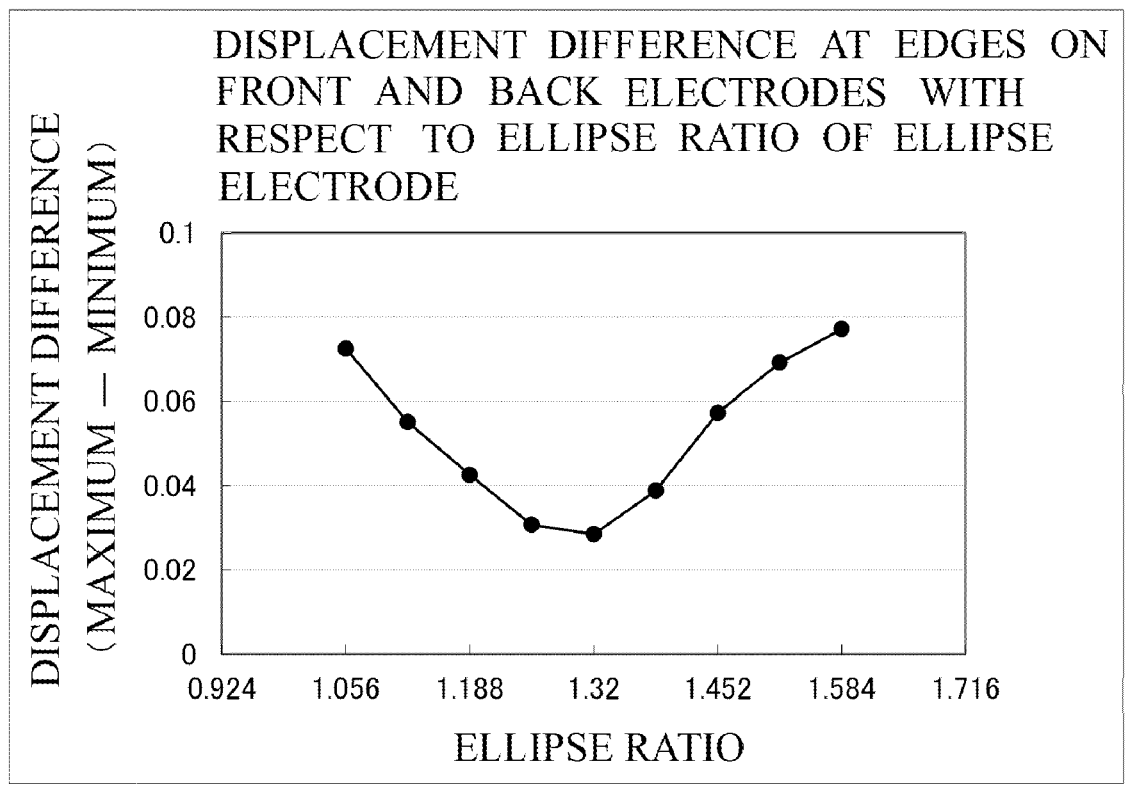
FIG. 11 is a drawing illustrating a gist of the simulation results of the ellipse ratio.
Figure 12A:
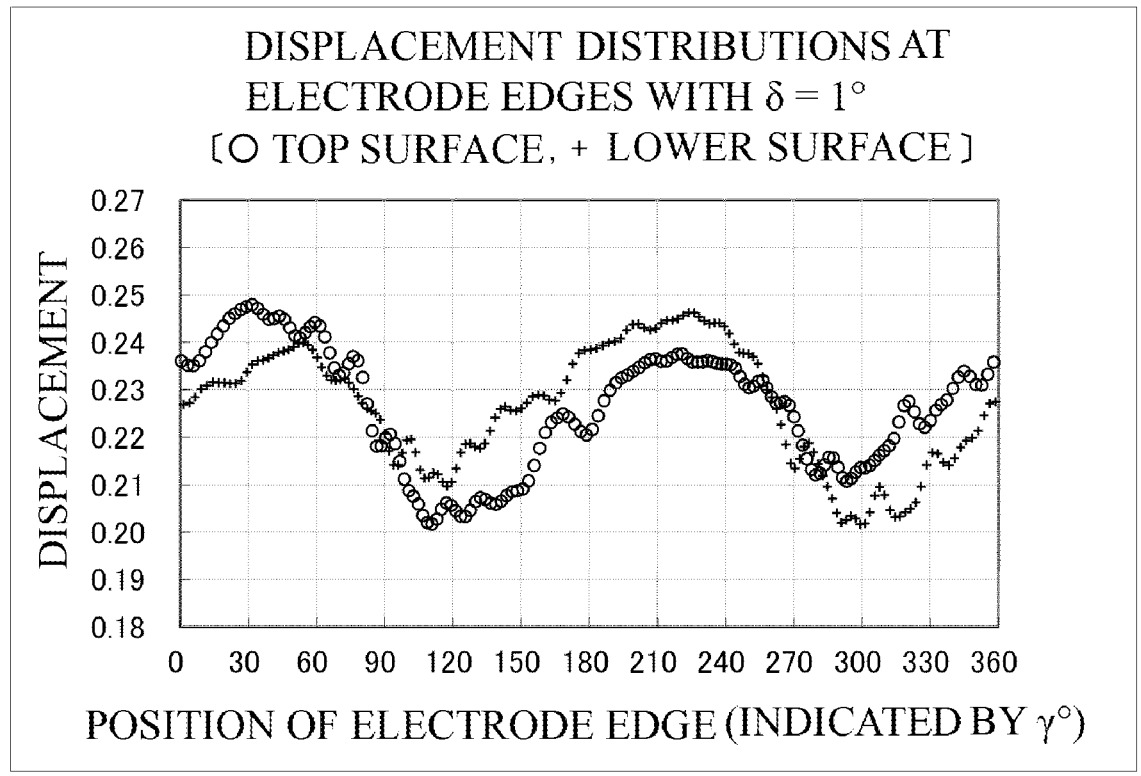
FIG. 12A, FIG. 12B, and FIG. 12C are drawings describing simulation results of an in-plane rotation angle δ of an excitation electrode.
Figure 12B:
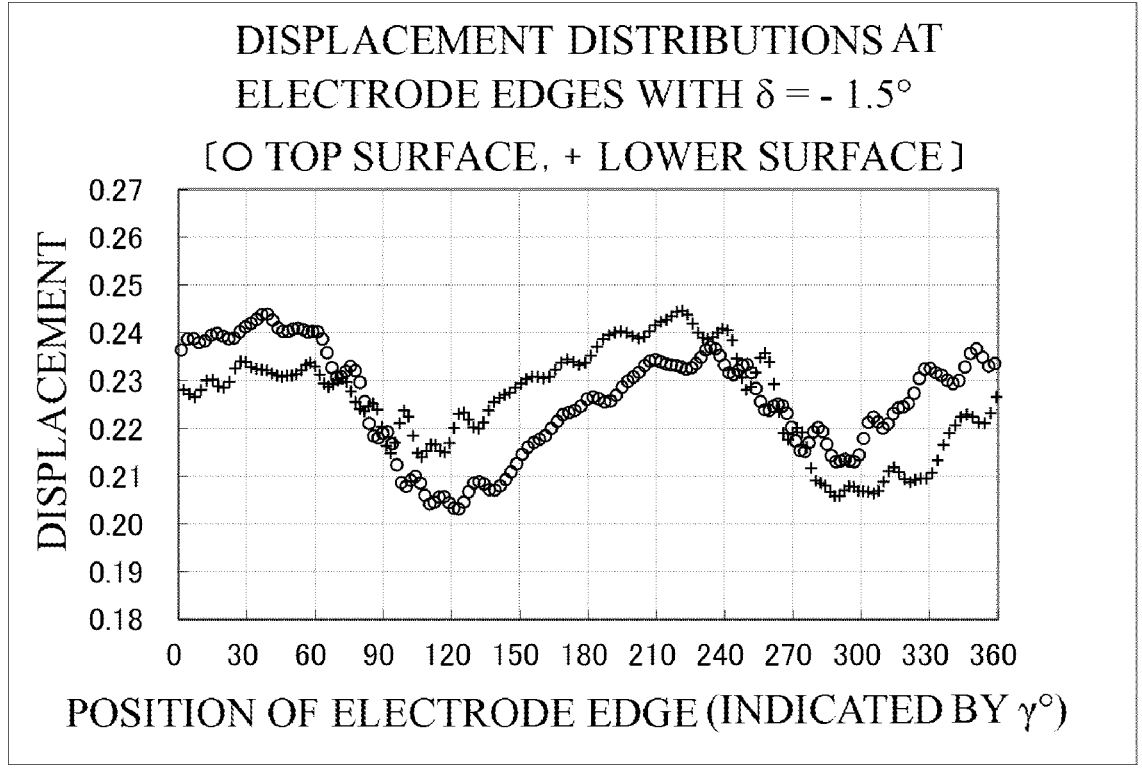
Figure 12C:
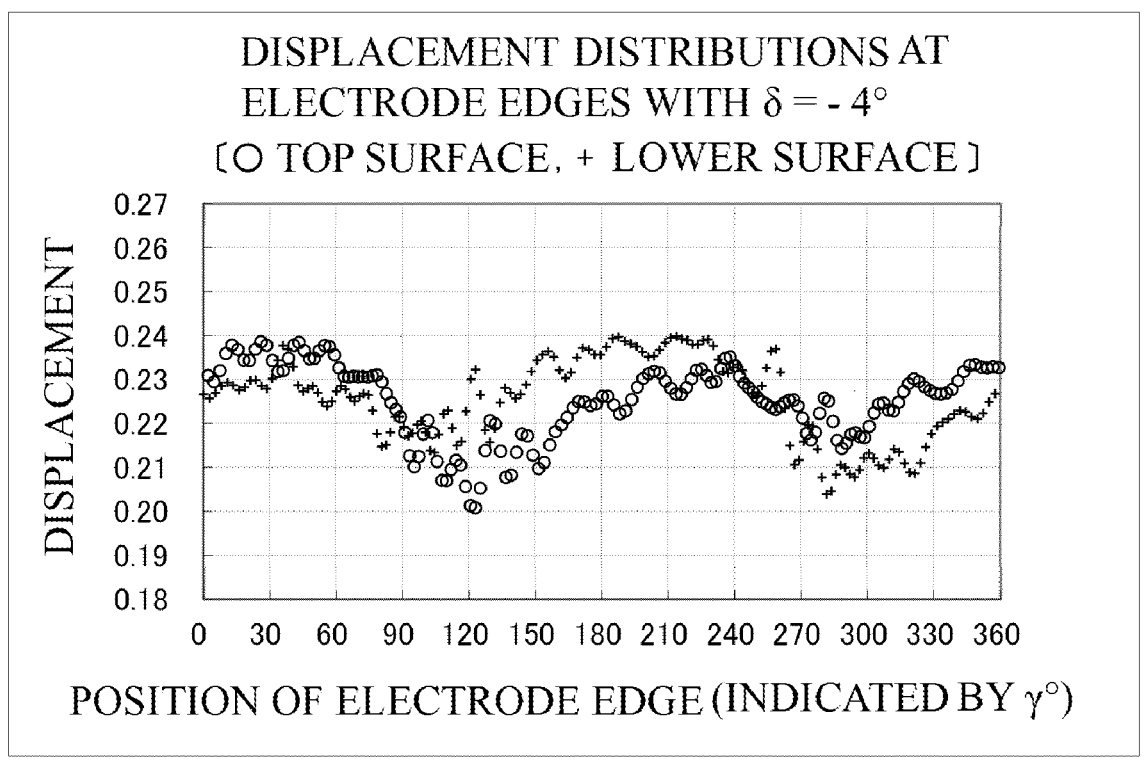
Figure 13A:
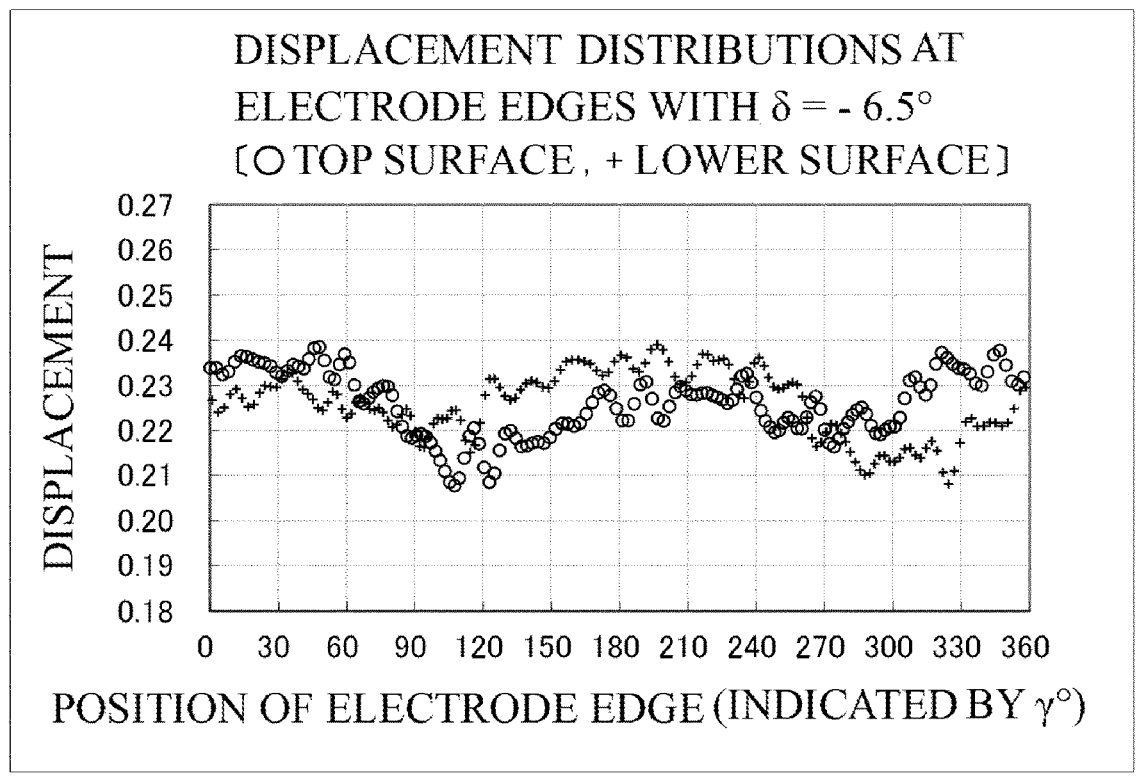
FIG. 13A, FIG. 13B, and FIG. 13C are drawings describing the simulation results of the in-plane rotation angle δ of the excitation electrode continuous with FIG. 12C.
Figure 13B:
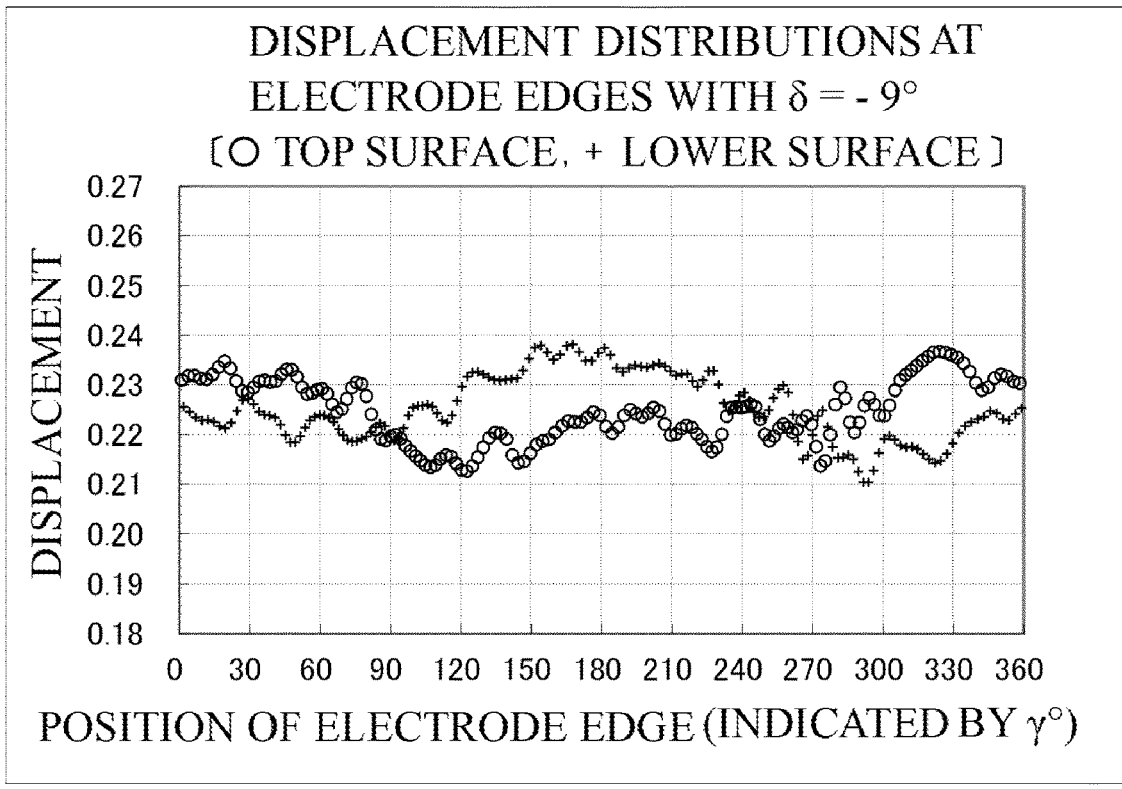
Figure 13C:
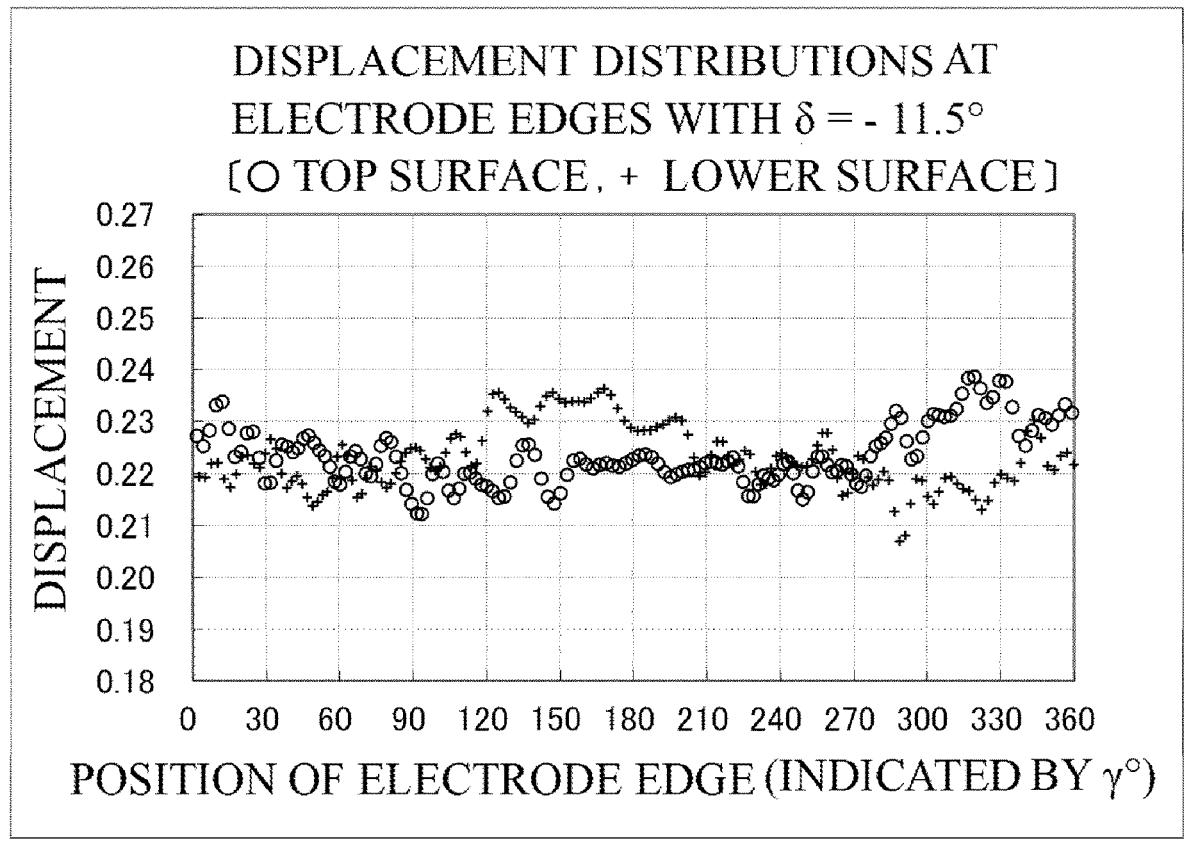
Figure 14A:
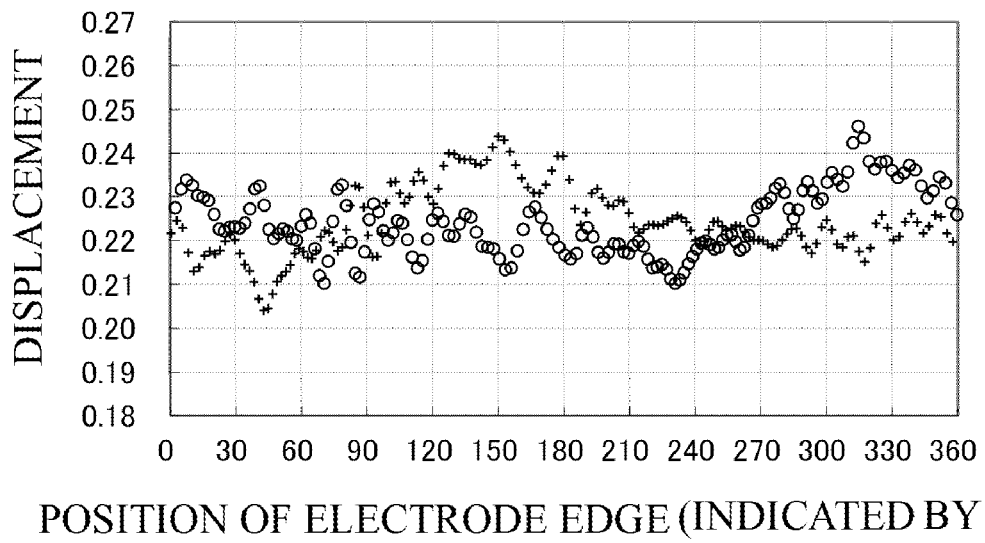
FIG. 14A, FIG. 14B, and FIG. 14C are drawings describing the simulation results of the in-plane rotation angle δ of the excitation electrode continuous with FIG. 13C.
Figure 14B:
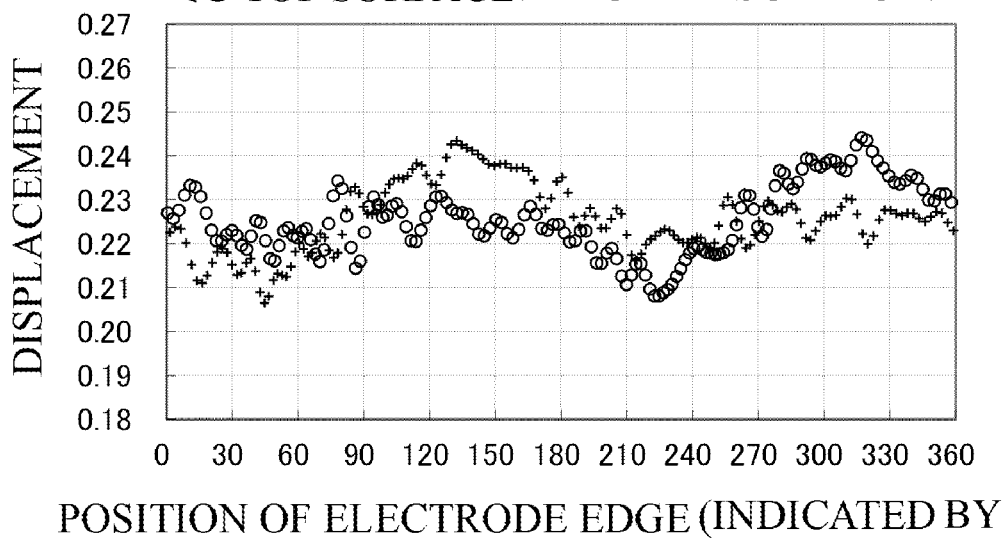
Figure 14C:
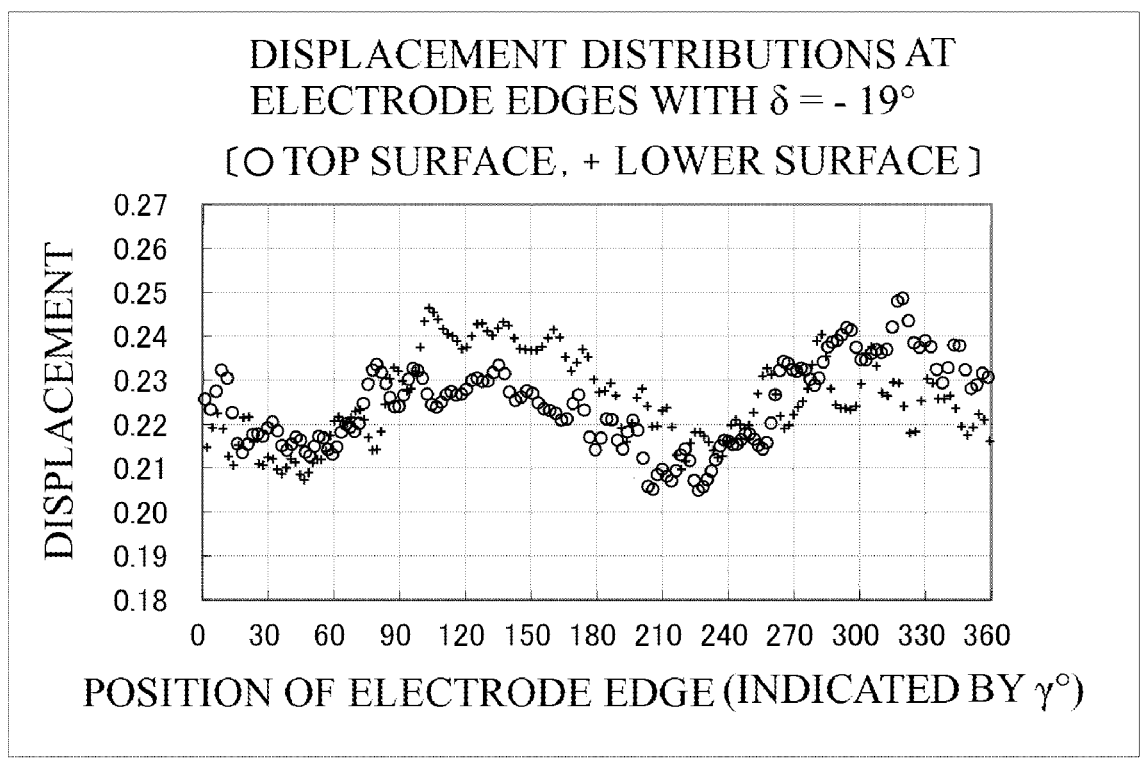

FIG. 11 is a drawing summarizing a gist of the results of FIG. 8A to FIG. 8C, FIG. 9A to FIG. 9C, and FIG. 10A to FIG. 10C. Specifically, FIG. 11 shows differences between the displacement distributions at the edge on the first excitation electrode and the displacement distributions at the edge on the second excitation electrode in the above-described nine kinds of respective simulations differentiating the ellipse ratio by a difference between a maximum value and a minimum value among all displacements regardless of the front and the back surfaces. This indicates that, the smaller this difference is, the displacement distributions at the edges on the excitation electrodes on the front and the back surfaces are flat.

First, as apparent from FIG. 8A to FIG. 10C, the effect of the first embodiment brought by displacing the excitation electrodes on the front and the back surfaces by the predetermined positional relationships exhibits the identical trend in the displacement distributions at the respective edges on the first excitation electrode 13a and the second excitation electrode 13b, that is, both show the displacement distributions with approximately sine wave shape even if the ellipse ratio is changed. However, as apparent from comparisons of FIG. 8A to FIG. 10C and especially from FIG. 11, it is seen that changing the ellipse ratio changes flatness of the respective displacement distributions at the edges on the first and the second excitation electrodes 13a and 13b. That is, it is seen that, the displacement distribution becomes flat most with the ellipse ratio of 1.32 (see FIG. 9B). When the ellipse ratio increases and decreases from 1.32, the displacement distribution gradually draws the sine wave shape and starts forming unevenness. It is thought that, the flat displacement distribution at the edge on the excitation electrode is preferable to, for example, reduce the unnecessary vibration compared with the case other than that; therefore, it can be said that the excitation electrode with the predetermined ellipse ratio is effective.

According to the simulation results with the ellipse ratio 1.32 as the reference, the M-SC-cut crystal resonator vibrating in the C mode and vibrating at the fundamental wave preferably has the ellipse ratio in a range of 1.32±10% and more preferably in a range of 1.32±5%. Following this simulation procedure, preferable ellipse ratios at a third harmonic and a fifth harmonic in the C mode; and the fundamental wave, the third harmonic, and the fifth harmonic in the B mode of the M-SC-cut were also examined. The following Table 3 shows the preferable ellipse ratios at the respective levels determined through these examinations in columns on the ellipse ratio. The preferable ellipse ratios for the respective SC-cut, IT-cut, and AT-cut were similarly determined. The following Table 4, Table 5, and Table 6 each show these results in the columns on the ellipse ratio. According to the examinations on the simulation results by the inventor, it is able to be judged that the preferable allowable range of the ellipse ratio of the excitation electrode in each cut type is ±10% and is more preferably ±5%.

TABLE 3

Preferable Ellipse Ratios and Directions of Ellipse for M-SC-Cut

| Mode | Order | Ellipse ratio a/b | Direction of ellipse °δ |
|---|---|---|---|
| C | 1 | 1.32 | −9 |
| C | 3 | 0.91 | −15 |
| C | 5 | 0.93 | −10 |
| B | 1 | 0.7 | −6 |
| B | 3 | 1.56 | −33 |
| B | 5 | 0.6 | 34 |

TABLE 4

Preferable Ellipse Ratios and Directions of Ellipse for SC-Cut

| Mode | Order | Ellipse ratio a/b | Direction of ellipse °δ |
|---|---|---|---|
| C | 1 | 1.32 | −7 |
| C | 3 | 0.93 | −17 |
| C | 5 | 0.95 | −12 |
| B | 1 | 0.7 | −6 |
| B | 3 | 1.41 | −32 |
| B | 5 | 0.72 | 35 |

TABLE 5

Preferable Ellipse Ratios and Directions of Ellipse for IT-Cut

| Mode | Order | Ellipse ratio a/b | Direction of ellipse °δ |
|---|---|---|---|
| C | 1 | 1.32 | −3 |
| C | 3 | 0.95 | −38 |

TABLE 5-continued

Preferable Ellipse Ratios and Directions of Ellipse for IT-Cut

| Mode | Order | Ellipse ratio a/b | Direction of ellipse °δ |
|---|---|---|---|
| C | 5 | 0.98 | −40 |
| B | 1 | 0.7 | −3 |
| B | 3 | 1.3 | −35 |
| B | 5 | 0.82 | 40 |

TABLE 6

Preferable Ellipse Ratios and Directions of Ellipse for AT-Cut

| Mode | Order | Ellipse ratio a/b | Direction of ellipse °δ |
|---|---|---|---|
| C | 1 | 1.26 | 0 |
| C | 3 | 1.05 | 0 |
| C | 5 | 1.14 | 0 |

2-2. Examinations on In-Plane Rotation Angle of Excitation Electrode with Respect to Crystal Element The following describes a proper range of the in-plane rotation angle δ of the elliptical excitation electrode with respect to the crystal element.

First, simulation results under conditions of the use of the M-SC-cut crystal element, the fundamental wave mode in the C mode as the mode of vibration, α=25.5° and β=0.2° as the angles α and β, which determine the positional relationship between the e first excitation electrode 13a and the second excitation electrode 13b, and the ellipse ratio of 1.32 are as follows. The angle δ during the simulations is 1°, −1.5°, −4°, −6.5°, −9°, −11.5°, −14°, −16.5°, and −19°. Here, as shown in FIG. 7B, the direction of the angle δ is, using the Y'-axis as the rotation axis on the positive Y'-surface of the crystal element 11, defined as positive by the counter-clockwise rotation and defined as negative by the clockwise rotation.

FIG. 12A to FIG. 12C, FIG. 13A to FIG. 13C, and FIG. 14A to FIG. 14C show the displacement distributions obtained through the above-described simulations. FIG. 12A to FIG. 14C show the edge positions of the excitation electrodes specified by the angle γ on the horizontal axis and the displacements when the crystal element model vibrates on the vertical axis similar to the first embodiment. The displacement is indicated by the value normalized by the maximum displacement similar to the first embodiment. In FIG. 10A to FIG. 12C, the characteristic diagrams plotted by ○ are the displacement distributions of the edges on the first excitation electrode 13a and the characteristic diagrams plotted by + are the displacement distributions of the edges on the second excitation electrode 13b.

Figure 15:
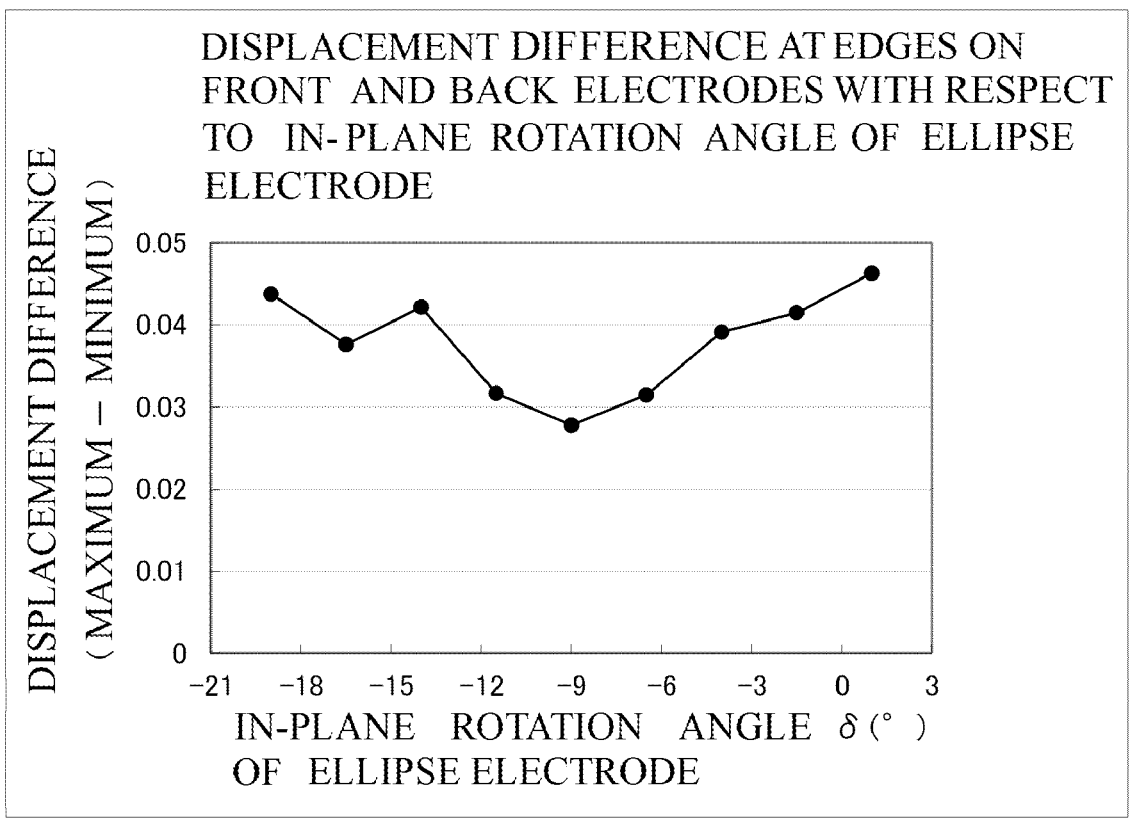
FIG. 15 is a drawing illustrating a gist of the simulation results of the in-plane rotation angle δ.

FIG. 15 is a drawing summarizing a gist of the results of FIG. 12A to FIG. 12C, FIG. 13A to FIG. 13C, and FIG. 14A to FIG. 14C. Specifically, FIG. 15 shows differences between the displacement distributions at the edge on the first excitation electrode and the displacement distributions at the edge on the second excitation electrode in the above-described nine kinds of respective simulations differentiating the in-plane rotation angle δ by a difference between a maximum value and a minimum value among all displacements regardless of the front and the back surfaces. This indicates that, the smaller this difference is, the displacement distributions at the edges on the excitation electrodes on the front and the back surfaces are flat.

As apparent through comparisons of FIG. 12A to FIG. 14C and apparent also from FIG. 15, it is seen that changing the angle δ, which is the direction of the ellipse, changes the displacement distributions at the edges on the first and the second excitation electrodes 13a and 13b. That is, it is seen that, the displacement distributions at the respective edges on the first and the second excitation electrodes for the M-SC-cut become flat most compared with the other displacement distributions and both are similar with δ=−9°. It is seen that, when the angle δ increases and decreases from −9°, the unevenness increases and a difference between both becomes large. Therefore, the angle δ is preferably −9°. According to simulation results by the inventor, it is able to be judged that the allowable range is ±5° and is more preferably ±3°. Following this simulation procedure, the preferable angles δ at the third harmonic and the fifth harmonic in the C mode of the M-SC-cut, the fundamental wave, the third harmonic, and the fifth harmonic in the B mode of the M-SC-cut, and further the fundamental wave, the third harmonic, and the fifth harmonic in the respective modes of the SC-cut, the IT-cut, and the AT-cut were determined. The above-described Table 3, Table 4, Table 5, and Table 6 show these results in the respective columns on the direction of the ellipse. In all cases, it is able to be judged that the preferable allowable range of the direction of ellipse 6 is ±5° and is more preferably ±3°.

3. Actual Structural Examples

Figure 16A:
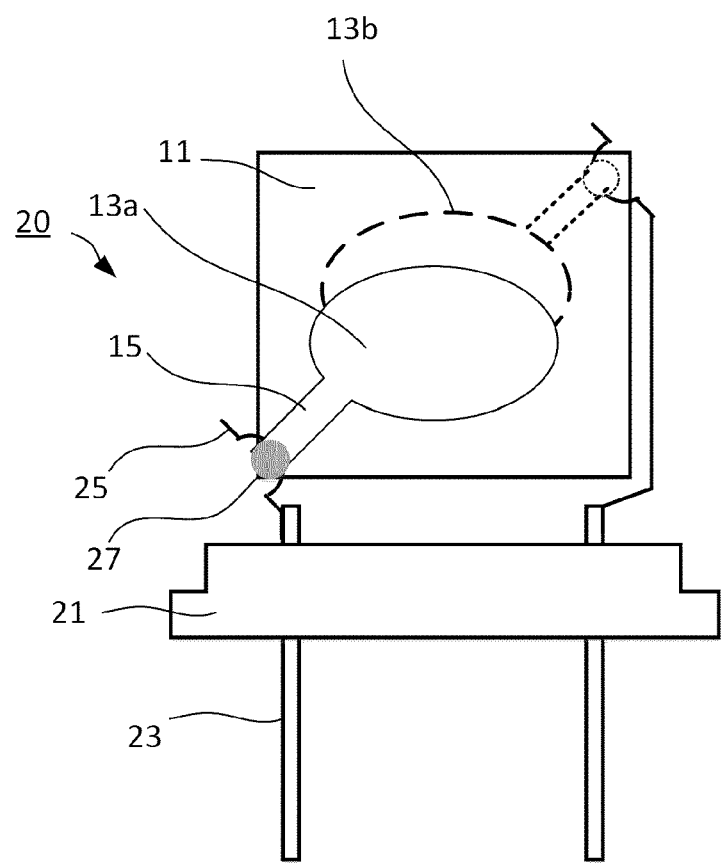
FIG. 16A and FIG. 16B are drawings illustrating a structural example of an actual crystal resonator of this disclosure.
Figure 16B:
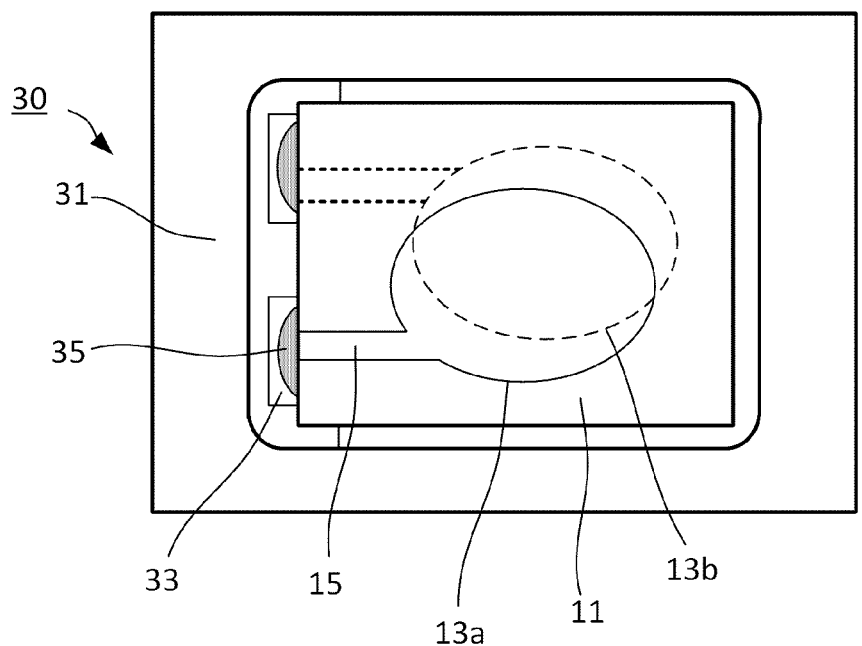

The following describes the actual structural examples of the crystal resonator according to the above-described embodiments. FIG. 16A and FIG. 16B are explanatory drawings of the structural examples.

The structural example illustrated in FIG. 16A is an example that applies this disclosure to a lead type crystal resonator 20 and is a schematic diagram viewing the crystal resonator 20 from a side surface. This crystal resonator 20 includes a base 21, leads 23 disposed at this base, and clip terminals 25 disposed at distal ends of the leads. The structure fixes the crystal element 11 to the clip terminals 25. In detail, the crystal element 11 includes extraction electrodes 15, which are extracted from the excitation electrodes 13a and 13b on the front and the back surfaces. The crystal element 11 is fixed to the clip terminals 25 near terminals of the extraction electrodes 15 with conductive adhesives 27. Actually, a cap (not illustrated) to seal the crystal element 11 is bonded to the base.

The structural example illustrated in FIG. 16B is an example that applies this disclosure to a surface mount type crystal resonator 30 and is a schematic diagram viewing the crystal resonator 30 from a top surface. This crystal resonator 30 includes a ceramic base 31 and support pads 33 disposed at this base. The structure fixes the crystal element 11 to the support pads 33. In detail, the crystal element 11 includes the extraction electrodes 15, which are extracted from the excitation electrodes 13a and 13b, on the front and the back surfaces. The crystal element 11 is fixed to the support pads 33 near terminals of the extraction electrodes 15 with conductive adhesives 35. Actually, a lid member (not illustrated) to seal the crystal element 11 is bonded to the base. Additionally, a mounting terminal (not illustrated) is provided to an outer bottom surface of the ceramic base. This mounting terminal is electrically connected to the support pads.

Apparently, these structural examples are preferable examples of the disclosure and another structure may be applied.

4. Third Embodiment Configuration Disposing Inclined Portions at Edge Portions of Excitation Electrodes The above-described first and second embodiments configure the excitation electrodes with the thickness substantially identical across the whole region. Meanwhile, disposing the inclined portion at the edge portion of the excitation electrode is further preferable to reduce an unnecessary mode. This third embodiment is the example of the configuration.

Figure 17A:
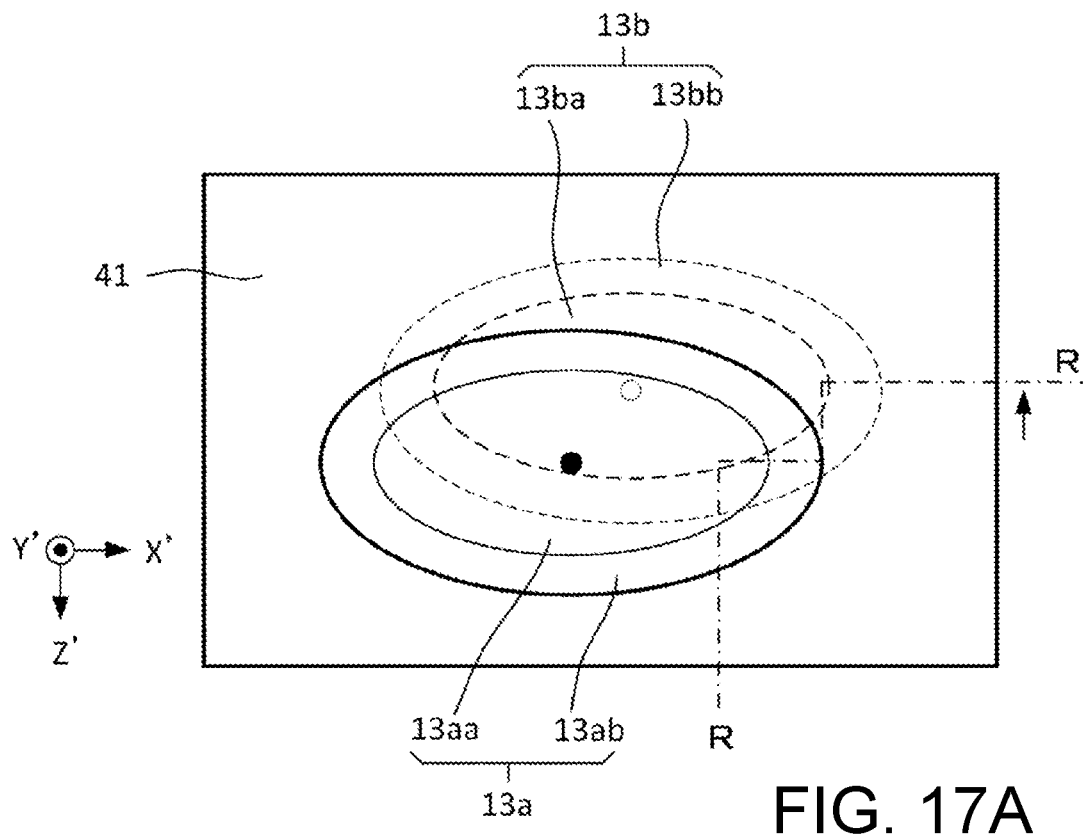
FIG. 17A and FIG. 17B are drawings describing a structure of a crystal resonator according to a third embodiment.
Figure 17B:
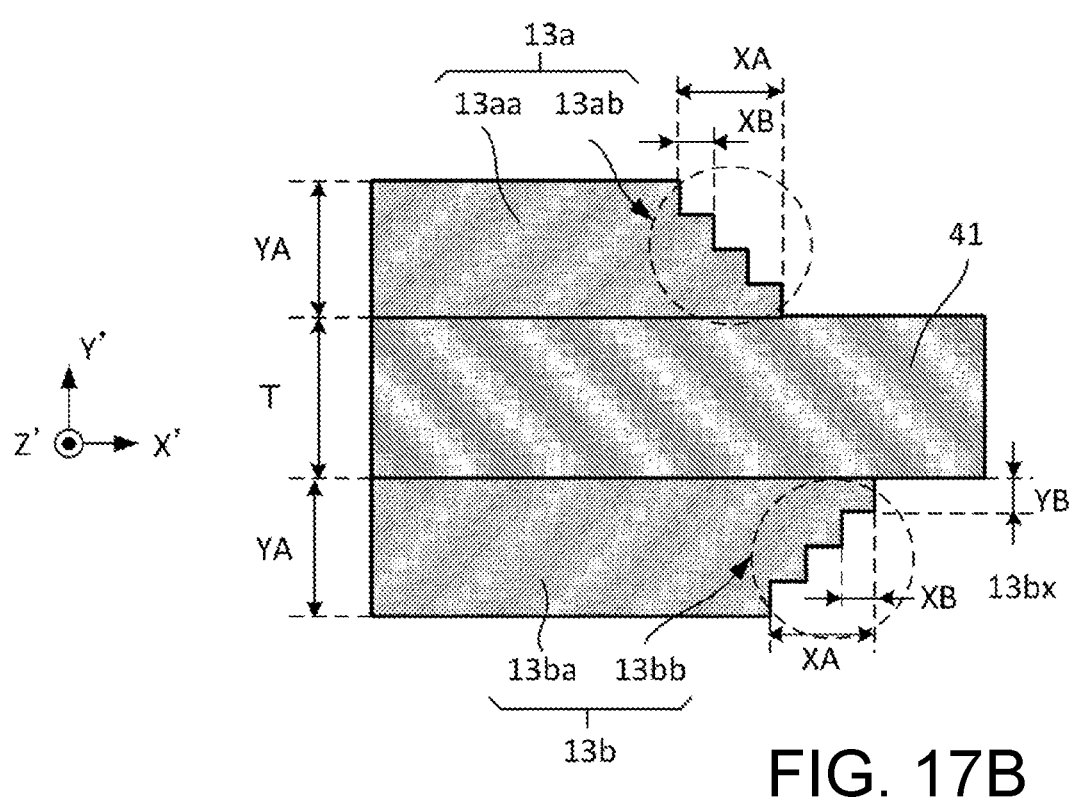

FIG. 17A and FIG. 17B are explanatory drawings of the crystal resonator according to this third embodiment. FIG. 17A and FIG. 17B are drawings especially focusing on a crystal element 41 provided with the crystal resonator according to the third embodiment. FIG. 17A is a plan view of the crystal element 41. FIG. 17B is a partial cross-sectional view taken along a line R-R of a crystal element 40. For further understanding of inclined portions 13a b and 13b b of the excitation electrodes 13a and 13b, FIG. 17B illustrates the thickness of the excitation electrode enlarged compared with the actual thickness.

This crystal element 41 features disposing main thickness portions 13aa and 13ba and the inclined portions 13ab and 13bb. At the main thickness portions 13aa and 13ba, the excitation electrodes 13a and 13b disposed on the front and the back surfaces of the crystal element 41 are each formed to have a constant thickness. The inclined portions 13ab and 13bb are formed at peripheral areas of these main thickness portions to have the thickness gradually decreasing from parts in contact with the main thickness portions to outermost peripheries of the excitation electrodes. The constant thickness of the main thickness portions 13aa and 13ba accepts a variation due to an inevitable variation during manufacturing.

The inclined portion 13ab in this example is configured to have four-step level differences. A width from the main thickness portion 13aa side to the outermost periphery of the excitation electrode 13a, namely, an inclination width is formed at XA, a width between the respective level differences is formed at XB. That is, this example forms the width XA with a length three times of the width XB. The thickness of the main thickness portion 13a a is formed at YA. A height between the respective level differences of the inclined portion 13ab is formed at YB. Therefore, the thickness YA has the thickness four times of the height YB.

The following simulations were conducted to confirm an effect brought by these inclined portions 13ab and 13bb. That is, two kinds of models, a model using an AT-cut crystal element and a model using a M-SC-cut crystal element, were prepared as the simulation models of the crystal element 41. The respective main thickness portions 13aa and 13ba of the excitation electrodes of these models were configured to have a film thickness YA of 140 nm and a frequency at main vibration of 26 MHz. The simulations in the case where the width XA of the inclined portions 13ab and 13bb was variously changed were conducted by the finite element method.

Figure 18:
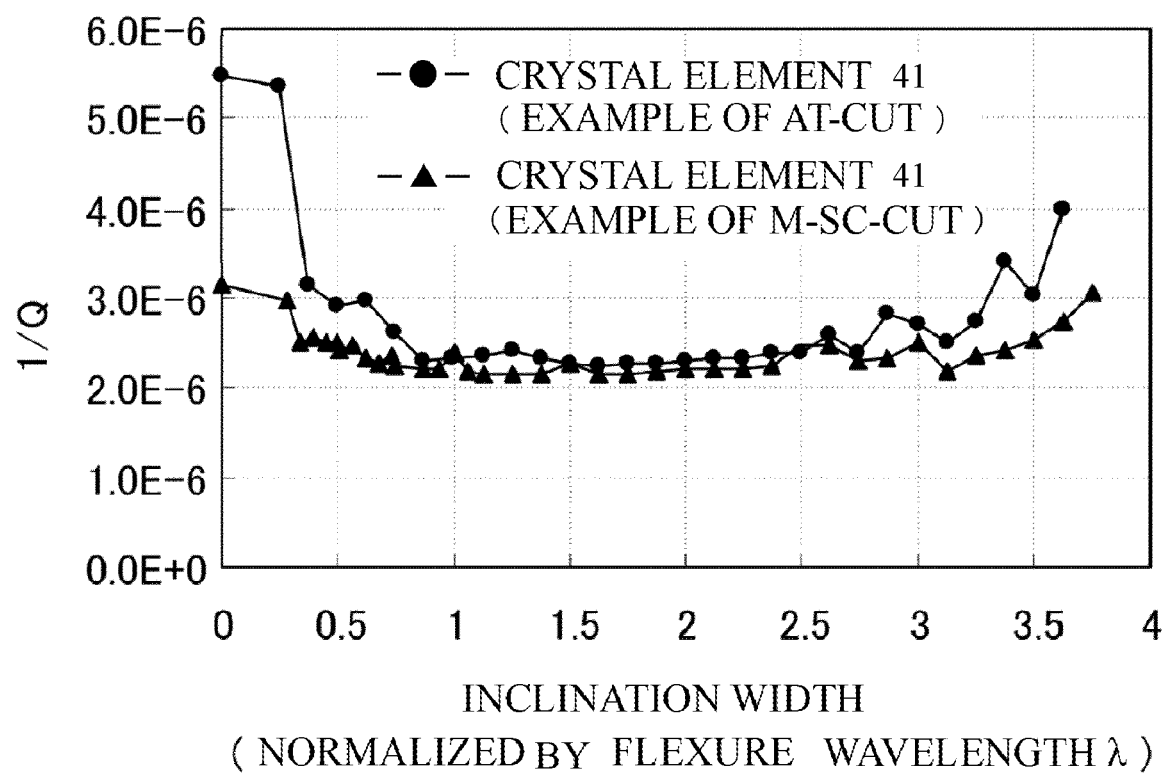
FIG. 18 is a drawing describing an effect brought by the crystal resonator according to the third embodiment.

The crystal resonator generates the unnecessary vibration, which is an unintended vibration in design unlike the main vibration, together with the main vibration (for example, the C mode). The crystal resonator formed of a quartz-crystal material and vibrating at the thickness-shear vibration such as the AT-cut and the M-SC-cut is greatly affected especially by a flexure vibration as the unnecessary vibration. The graph of FIG. 18 shows the inclination width normalized by a flexure wavelength $\lambda$, a wavelength of this flexure vibration, on the horizontal axis. Therefore, even with the identical scale, the inclination width shown in the graph of FIG. 18 differs in the dimensions of the inclination widths of the inclined portions 13ab and 13bb depending on whether the crystal element is the AT-cut or the M-SC-cut. For example, the main vibration with the vibration at a vibration frequency of 26 MHz produces the flexure wavelength $\lambda$ of approximately 100 µm at the AT-cut crystal element and the flexure wavelength $\lambda$ of approximately 110 µm at the M-SC-cut crystal element. At this time, the actual dimension of the inclination width indicated by "1" in the graph in FIG. 18 is 1×$\lambda$. The inclination width of the AT-cut crystal element is 1×$\lambda$=approximately 100 µm, and the inclination width of the M-SC-cut crystal element is 1×$\lambda$=approximately 110 µm.

The vertical axis of the graph in FIG. 18 shows the inverse of a Q factor indicative of a vibration energy loss at the main vibration. The black circle ● shows a property of the AT-cut crystal element model. The black triangle ▲ shows a property of the M-SC-cut crystal element model.

As apparent from FIG. 18, both models exhibit the low 1/Q indicative of the vibration energy loss, $3.0 \times 10^{-6}$ (denoted as "3.0 E−6" in FIG. 18) or less in a range where the inclination width normalized by the flexure wavelength $\lambda$ being "0.5" to "3". That is, it is seen that, when the inclination width is formed to have the length 0.5 times or more to 3 times or less of the flexure wavelength $\lambda$, the vibration energy loss is reduced. Especially, both models exhibit the low magnitude of 1/Q with the inclination width normalized by the flexure wavelength $\lambda$ in a range of "1" to "2.5" and further the variation is small. That is, it is seen that, in the case where the inclination width has the length 1 time to 2.5 times of the flexure wavelength, the vibration energy loss is further stably lowered.

The configuration that includes the inclined portions at the edge portions of the excitation electrodes is especially preferable for an application to a flat-plate-shaped crystal element. To improve the property of the crystal resonator, so-called convex crystal element whose thickness at an edge region of the crystal element itself is thin has been conventionally used. This confines the vibration energy, thereby ensuring restraining the unnecessary vibration. However, shaping the convex crystal element causes problems of taking a labor for the process and a cost increase. With this third embodiment, the inclined portion at the edge portion of the excitation electrode serves as the convex shape on the crystal element. Therefore, in the case where the inclined portion with the above-described structure is additionally applied to the configuration of this disclosure exemplified in the first and the second embodiments, which displace the excitation electrodes on the front and the back surfaces by the predetermined relationships, the properties of the crystal resonator are further improved and the cost is further reduced.

5. Fourth Embodiment Configuration Disposing Inclined Portion at Edge Portion of Excitation Electrode on One Surface The above-described third embodiment describes the structure that includes the inclined portions on the respective edge portions of the excitation electrodes on the front and the back surfaces. Meanwhile, when the crystal resonator is fabricated, the excitation electrodes are trimmed by ion beam with an argon or a similar method for adjustment of the vibration frequency. This trimming process possibly disappears the inclined portions, resulting in the large vibration energy loss. To avoid this, the inclined portion may not be disposed on the excitation electrode on the frequency adjustment surface of the crystal element but the inclined portion may be disposed only on the excitation electrode on the surface opposite to the frequency adjustment surface. This fourth embodiment is the example of the structure.

Figure 19A:
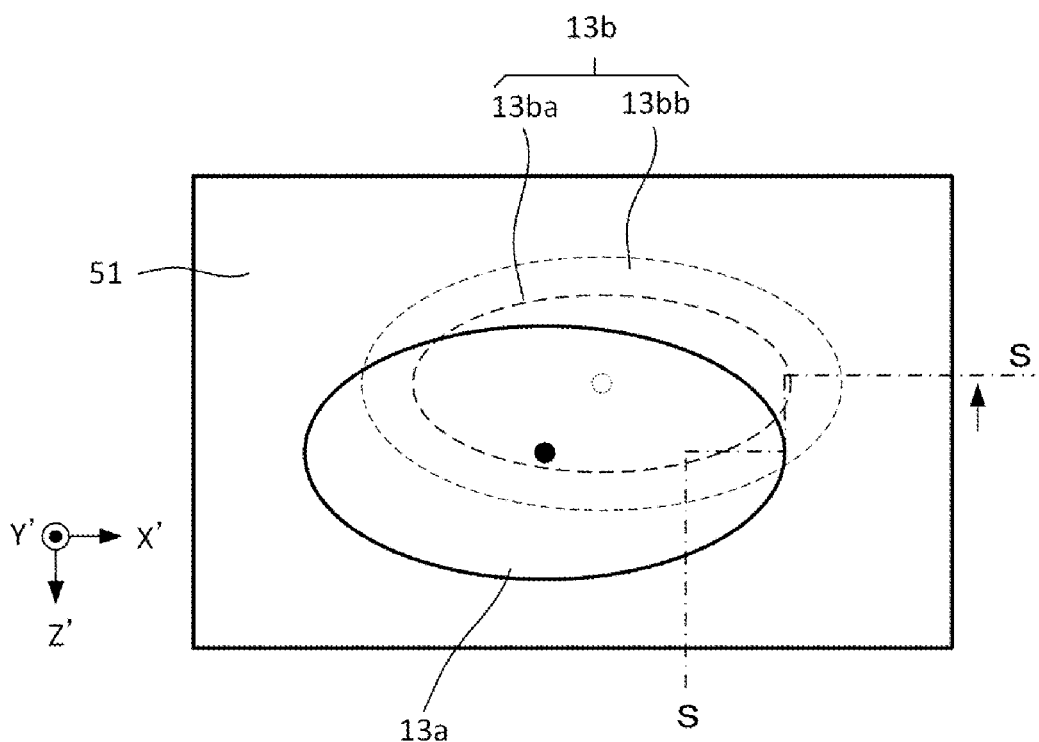
FIG. 19A and FIG. 19B are drawings describing a structure of a crystal resonator according to a forth embodiment.
Figure 19B:
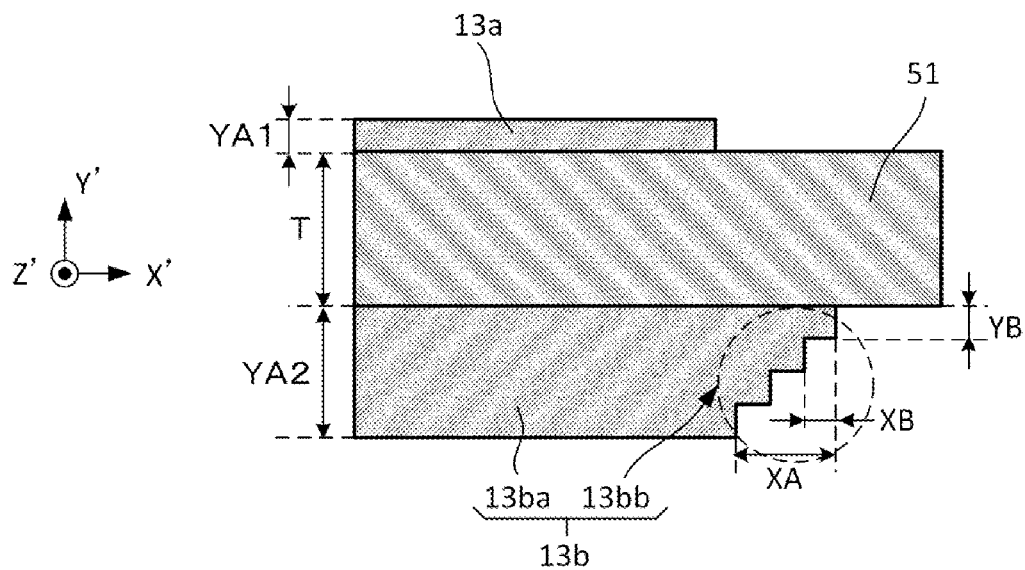

FIG. 19A and FIG. 19B are explanatory drawings of the crystal resonator according to this fourth embodiment. FIG. 19A and FIG. 19B are drawings especially focusing on a crystal element 51 provided with the crystal resonator according to this fourth embodiment. FIG. 19A is a plan view of the crystal element 51, and FIG. 19B is a partial cross-sectional view taken along a line S-S of the crystal element 51. This fourth embodiment has a structure that includes the inclined portion on the edge portion only on the excitation electrode on the side where the frequency adjustment is not performed of the crystal element. FIG. 19A and FIG. 19B exemplify the structure where only the excitation electrode 13b among the excitation electrodes 13a and 13b includes the main thickness portion 13ba and the inclined portion 13bb. The configuration of this excitation electrode 13b may be the configuration described in the third embodiment. That is, as described in the third embodiment, the excitation electrode 13b includes the main thickness portion 13ba, which is formed at a constant thickness YA2 (YA in the third embodiment), and the inclined portion 13bb, which is formed on the peripheral area of this main thickness portion 13ba and is formed to have the thickness gradually decreasing from the part in contact with the main thickness portion to the outermost periphery of the excitation electrode. Additionally, the inclination width XA has the length 0.5 times or more to three times or less of the flexure wavelength λ or preferably 1 time to 2.5 times. Meanwhile, the film thickness of the excitation electrode 13a on the side without the inclined portion is designed to be YA1. Details of the configuration of the film thicknesses YA1 and YA2 will be described later. This crystal element 51 is mounted to a container for the crystal resonator (for example, see FIG. 16A and FIG. 16B) such that the excitation electrode 13b is configured to be the side where the frequency adjustment is not performed.

Figure 20:
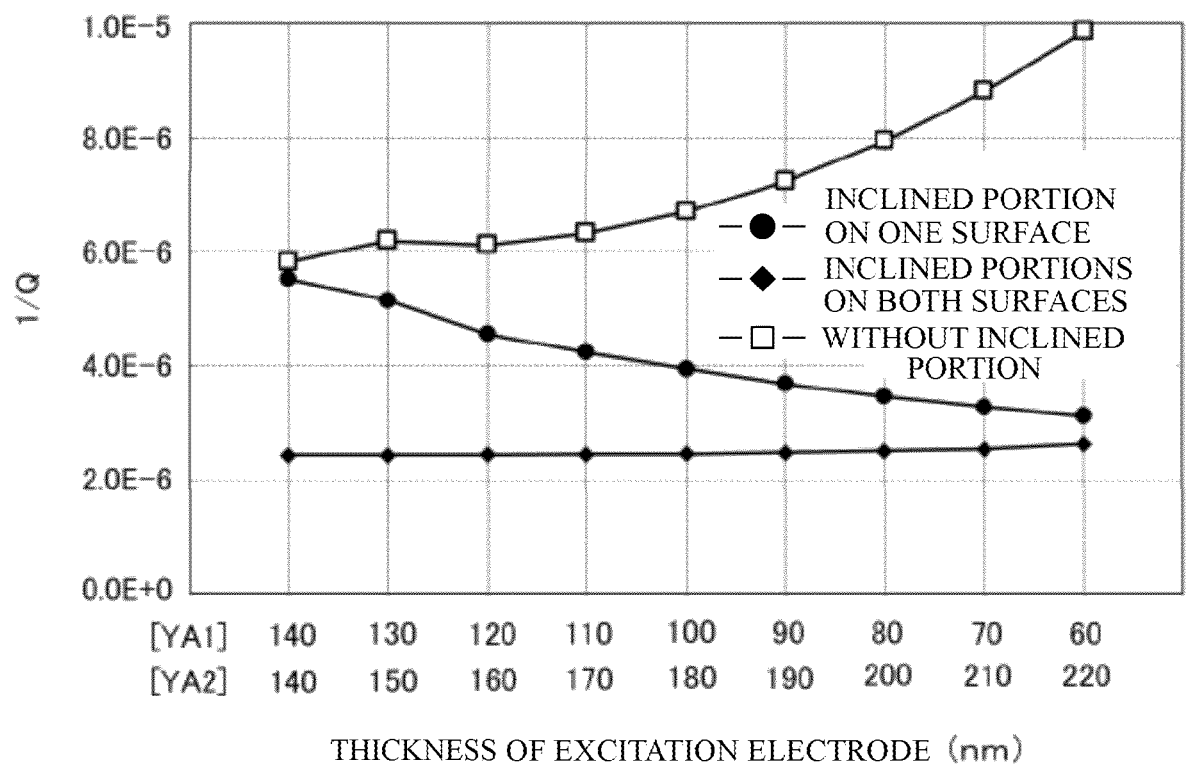
FIG. 20 is a drawing describing an effect brought by the crystal resonator according to the forth embodiment.

The following describes matters to be noted to embody this fourth embodiment with reference to FIG. 20.

FIG. 20 illustrates analysis results of main vibration energy loss (1/Q) at the following three kinds of prepared simulation models by the finite element method. The first model among the three kinds is the model corresponding to the crystal element 51 according to the fourth embodiment, that is, the model that includes the inclined portion only on the excitation electrode on one surface of the crystal element. The second model is the model corresponding to the crystal element 41 according to the third embodiment, that is, the model that includes the inclined portions on the excitation electrodes on both surfaces of the crystal element. The third model is the model corresponding to the crystal element 11 according to the first embodiment, that is, the model that does not include the inclined portions on the excitation electrodes on the crystal element.

All models employ the M-SC-cut quartz-crystal material, a gold (Au) for all excitation electrodes, and the frequency at the main vibration of 30 MHz (flexure wavelength λ is approximately 95 µm), and the inclination width XA of the models with the inclined portion is designed to 133 µm (1.4 times of the flexure wavelength λ). As the film thickness of the excitation electrode, the graph in FIG. 20 shows the thickness YA1 of the excitation electrode 13a and the thickness YA2 of the main thickness portion 13ba of the excitation electrode 13b on the horizontal axis. This simulation sets the sum of the thickness YA1 and the thickness YA2 always to be 280 nm. In FIG. 20, the thickness YA2 increases as heading for the right in the graph. FIG. 20 shows the vibration energy loss (1/Q) of the main vibration (for example, the C mode) on the vertical axis. FIG. 20 shows the calculation results of the model that includes the inclined portion only on the excitation electrode on the one surface by the black circle ● FIG. 20 shows the calculation results of the model that includes the inclined portions on the excitation electrodes on both surfaces by the black diamond ◆. FIG. 20 shows the calculation results of the model that does not include the inclined portion on the excitation electrodes by the white square □.

The reason why the simulation is performed under the condition of the sum of the thickness YA1 and the thickness YA2 always being 280 nm is to secure a so-called energy confinement in the crystal resonator. That is, to confirm the effects of the disclosure assuming that the energy confinement is secured. Note that, the value 280 nm is one example according to the size, the shape, and the frequency of the crystal elements according to the embodiments.

As apparent from FIG. 20, the model that includes the inclined portion only on the excitation electrode on the one surface exhibits 1/Q, which indicates the vibration energy loss, of approximately $5.5 \times 10^{-6}$ (The graph in FIG. 20 denotes "$\times 10^{-6}$" as "E-6.") with the thickness YA1 and the thickness YA2 of 140 nm. However, this model thins the thickness YA1 of the excitation electrode that does not include the inclined portion and thickens the thickness YA2 of the excitation electrode that includes the inclined portion instead, lowering 1/Q. This model exhibits 1/Q of approximately $3.1 \times 10^{-6}$ with the thickness YA1 of 60 nm and the thickness YA2 of 220 nm. That is, it is seen that the model that includes the inclined portion only on the excitation electrode on the one surface includes the inclined portion only on the excitation electrode on the one surface and thins the thickness of the excitation electrode that does not include the inclined portion reduces the loss of the crystal resonator. Meanwhile, even if the thickness YA1 and the thickness YA2 are changed in the model that includes the inclined portions on the excitation electrodes on both surfaces, 1/Q remains the same, approximately $2.4 \times 10^{-6}$ to approximately $2.6 \times 10^{-6}$, apparently preferable as the property. However, the model that includes the inclined portions on the excitation electrodes on both surfaces disappears the inclined portion on the excitation electrode on the frequency adjustment surface during the frequency adjustment; therefore, the actual product cannot maintain this property. When the thickness YA1 and the thickness YA2 are changed in the model that does not include the inclined portions on the excitation electrodes on both surfaces, the increase in the thickness YA2 increases 1/Q, and 1/Q becomes approximately $9.9 \times 10^{-6}$ with the thickness YA2 of 220 nm. That is, the model that does not include the inclined portion on the excitation electrodes on both surfaces generates the unnecessary mode caused by the level difference at the edge portion of the excitation electrode as the thickness YA2 thickens, increasing the loss.

The effect of the crystal resonator according this fourth embodiment occurs because of the following reason. The crystal resonator generates the unnecessary vibration, which is the unintended vibration in design unlike the main vibration, together with the main vibration (for example, the C mode). With the crystal resonator such as the AT-cut and the M-SC-cut crystal resonators formed of the crystal element made of the quartz-crystal material and vibrating at the thickness-shear vibration, modes other than the main vibration are the unnecessary modes inhibiting the oscillation of main vibration. Among the unnecessary vibration, the vibration in the unnecessary mode, the flexure vibration is known as the vibration especially affecting the main vibration. Through the conversion of the vibration energy into the flexure vibration mainly at the end portion of the excitation electrode, the flexure vibration is superimposed on the main vibration. Thus, the entire piezoelectric vibrating piece is vibrated at the flexure vibration. Accordingly, the conductive adhesive, which holds the crystal element, absorbs the vibration energy. Such energy loss by the flexure vibration leads to the vibration energy loss.

Although the crystal resonator of this fourth embodiment with the film thicknesses YA1 and YA2 of the excitation electrodes both being 140 nm includes the inclined portion 13bb at the excitation electrode 13b, the excitation electrode 13a does not include the inclined portion. This does not sufficiently reduce the influence of the flexure vibration to the main vibration; therefore, the loss is large and equivalent to the model without the inclined portion. However, the crystal resonator according to the fourth embodiment reduces 1/Q as the thickness YA1 of the excitation electrode 13a without the inclined portion thins. The loss is close to the model that includes the inclined portions on the excitation electrodes on both surfaces with the thickness YA1 of 60 nm. This is probably because thinning the thickness YA1 of the excitation electrode without the inclined portion reduces the influence of the level difference at the electrode end portion and reduces the flexure vibration. Therefore, suppose that the fourth embodiment has the thickness YA1 of the excitation electrode 13b without the inclined portion by which an induction of the unnecessary mode can be reduced at the end portion of the excitation electrode 13b and the function as the conductive film originated from the electrode can be obtained, the thickness YA1 is preferably thin as much as possible. It is known that the lower limit range of the thickness at which the film can be established is 60 nm to 100 nm in the thin film technology. Taking this into consideration, to provide the function of the excitation electrode without the inclined portion, the thickness YA1 is in the range of 60 nm to 100 nm and preferably 60 nm to 80 nm.

With the crystal element 51 according to the fourth embodiment, instead of not performing a process such as a bevel process or a convex process on the crystal element 51, the excitation electrodes are formed to be the predetermined thicknesses to confine the vibration energy. It is preferable to select the thickness YA2 of the excitation electrode without the inclined portion such that the total thickness of the thicknesses YA1 and YA2 of the excitation electrodes becomes the film thickness at which the vibration energy is trapped. Specifically, the thickness YA2 can be determined considering the size, the frequency, and a similar specification of the piezoelectric vibrating piece from values approximately several % of the sum of the thicknesses of both excitation electrodes with respect to the plate thickness of the crystal element, for example, it is preferable to select the value from 2 to 5%.

This fourth embodiment can obtain the effects of the disclosure exemplified in the first and the second embodiments, which displace the excitation electrodes on the front and the back surfaces by the predetermined relationships. Additionally, the fourth embodiment can obtain the effects brought by disposing the inclined portion on the excitation electrode and the effects of ensuring avoiding damage of this inclined portion during the frequency adjustment.

6. Fifth Embodiment Configuration of Inclined Portion Accommodating Higher Harmonics The above-described third embodiment and fourth embodiment describe the proper values of the inclination width XA, the length of the inclined portion, for the fundamental wave. Meanwhile, there is an application of the crystal resonator that simultaneously outputs signals of two frequencies from the one crystal resonator. For example, WO2015/133472 discloses the fundamental wave the higher harmonics taken out from the one crystal element. This crystal element can use the one frequency as the output signal and the other frequency as a sensor signal for temperature compensation, and moreover, the two frequencies can be obtained by the one crystal resonator. This, for example, can reduce an individual difference in influence of the crystal element and therefore is preferable.

This fifth embodiment relates to the design further accommodating the fundamental wave and the higher harmonics in the above-described first to fourth embodiments. The crystal element according to this fifth embodiment features that the inclination width with the case of disposing the inclined portion on the excitation electrode in the various configurations according to the first embodiment to the fourth embodiment has the length of 0.84 times or more to 1.37 times or less of the first flexure wavelength, which is the wavelength in the flexure vibration in the fundamental wave of the thickness-shear vibration, and 2.29 times or more to 3.71 times or less of the second flexure wavelength, which is the wavelength in the flexure vibration in the third harmonic of the thickness-shear vibration.

Figure 21:
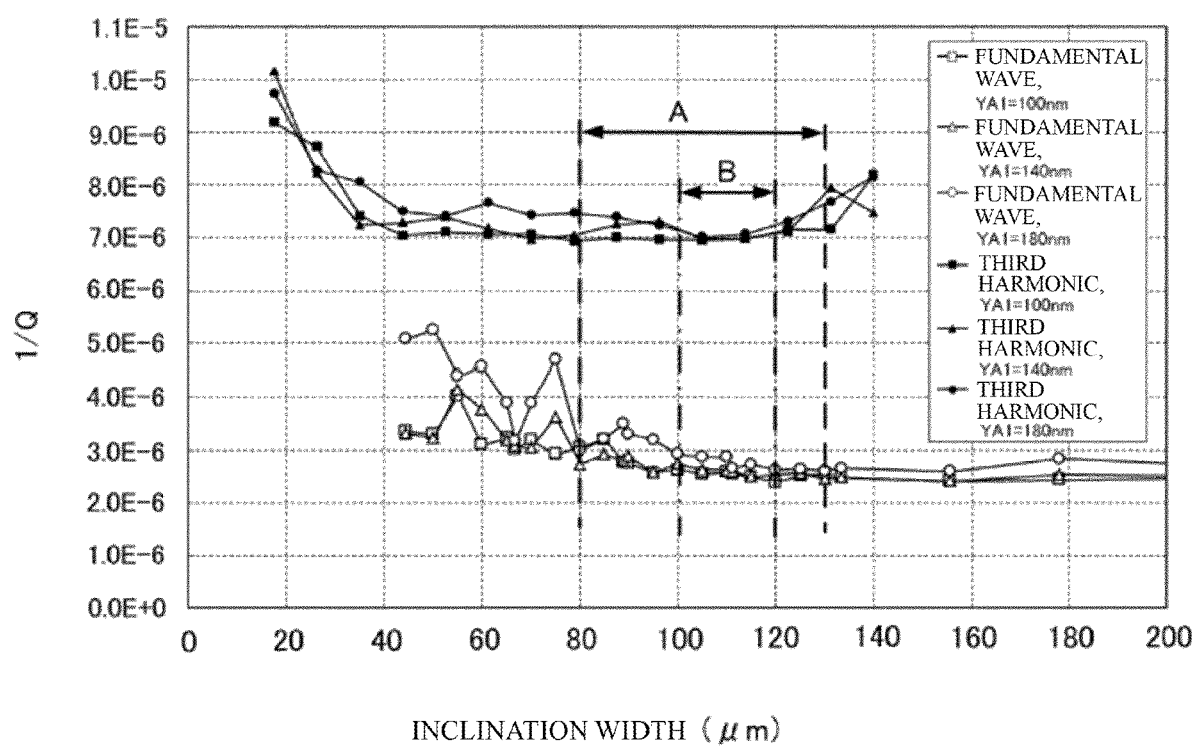
FIG. 21 is a drawing describing an effect brought by a crystal resonator according to a fifth embodiment.

FIG. 21 is a drawing illustrating the simulation results to describe the effect of this fifth embodiment. Specifically, FIG. 21 is a graph illustrating a relationship between values found by normalizing the inclination width of the excitation electrode by the wavelength at the flexure vibration and the vibration energy loss (1/Q) on the simulation model that includes the inclined portions on the excitation electrodes on both surfaces described with reference to FIG. 17A and FIG. 17B. FIG. 21 shows the calculation results from the simulations on the fundamental wave (frequency: 30 MHz) and the third harmonic (frequency: 90 MHz) when the film thickness YA1 of the main thickness portion 13aa (13ba) is 100 nm, 140 nm, and 180 nm using the simulation model where all the excitation electrodes are made of the gold (Au) and the C mode is the main vibration.

The horizontal axis of the graph in FIG. 21 shows the inclination width XA (μm). The vertical axis of the graph in FIG. 21 shows the inverse of the Q factor indicative of the vibration energy loss of the main vibration. FIG. 21 shows the loss of the crystal element with the oscillation at the fundamental wave at the thickness YA1 of the main thickness portion of 100 nm by the solid-while square □. FIG. 21 shows the loss of the crystal element with the oscillation at the fundamental wave at the thickness YA1 of 140 nm by the solid-while triangle Δ. FIG. 21 shows the loss of the crystal element with the oscillation at the fundamental wave at the thickness YA1 of 180 nm by the solid-while circle ○. FIG. 21 shows the loss of the crystal element with the oscillation at the third harmonic at the thickness YA1 of the main thickness portion of 100 nm by the black square ■. FIG. 21 shows the loss of the crystal element with the oscillation at the third harmonic at the thickness YA1 of 140 nm by the black triangle ▲. FIG. 21 shows the loss of the crystal element with the oscillation at the third harmonic at the thickness YA1 of 180 nm by the black circle ●.

As apparent from FIG. 21, the relationship between the inclination width and the vibration energy loss (1/Q) in the third harmonic exhibits the similar trend regardless of the size of the thickness YA1 at the main thickness portion. 1/Q, which indicates the vibration energy loss, becomes low, $8.0 \times 10^{-6}$ ("$\times 10^{-6}$" is denoted as "E−6" in the graph in FIG. 21) or less with the inclination width XA in a range of approximately 30 μm to approximately 130 μm. The relationship between the inclination width and the vibration energy loss (1/Q) in the fundamental wave exhibits the low 1/Q, which indicates the vibration energy loss, $4.0 \times 10^{-6}$ or less, with the inclination width XA in a range of approximately 80 μm or more. From these results, the vibration energy loss of the crystal resonator can be reduced both in the fundamental wave and the third harmonic in the range of the inclination width XA of approximately 80 μm to approximately 130 μm (range A in FIG. 21) where the vibration energy loss (1/Q) in the fundamental wave and the third harmonic are both low. Accordingly, the vibration energy loss of the crystal resonator in the case where the fundamental wave and the third harmonic are oscillated simultaneously is reduced.

Further, as apparent from FIG. 21, in the third harmonic, 1/Q, which indicates the vibration energy loss, is stable low in a range of the inclination width XA being approximately 40 μm to approximately 120 μm and therefore it is especially preferable. In the fundamental wave, 1/Q, which indicates the vibration energy loss, is low, $3.0 \times 10^{-6}$ or less, in range of the inclination width XA being approximately 100 μm or more and therefore it is especially preferable. From these results, the vibration energy loss of a crystal resonator can be especially reduced both in the fundamental wave and the third harmonic in the range of the inclination width XA of approximately 100 μm to approximately 120 μm (range B in FIG. 21) where the vibration energy loss (1/Q) in the fundamental wave and the third harmonic are both low. Accordingly, the vibration energy loss of the crystal resonator in the case where the fundamental wave and the third harmonic are oscillated simultaneously can be especially reduced.

7. Other Embodiments

While the embodiments of the crystal resonator of this disclosure are described above, this disclosure is not limited to the above-described embodiments. For example, the above-described examples show the examples of the rectangular crystal element as the crystal element; however, the planar shape of the crystal element may be a square, a circle, or an ellipse. The respective embodiments show the rectangular crystal element with the X'-direction as the long side and the Z'-direction as the short side; however, the long side and the short side may be the opposite directions. The electrode shape of the first embodiment may be the square or the circle in plan view. Although already described, the crystal element may be a plano-convex type. The example of the inclined portion disposed on the excitation electrode has the four steps; however, the configuration of the inclined portion is not limited to this. The inclined portion can employ any other configurations such as the number of steps different from the example or formation of not the stepped structure but an inclined surface. These inclined portions can be formed by, for example, the following methods. That is, a method that forms the films at the respective steps by a well-known film formation method of a metal film using a plating frame, a method that applies patterning of the formed metal film by photo lithography technique to the film formation of the respective steps, a method that forms a resist pattern where the film thickness corresponding to a part becoming the inclined portion is thinned on the fabricated metal film and processes a part of the metal film into an inclined shape by dry etching method using this pattern as a mask, or a similar method is applicable.

To embody this disclosure, the crystal element has a thickness in a Y'-axis direction of the crystal. The crystal element has a principle surface on an X'-Z'-surface of the crystal. The excitation electrodes disposed on the front and the back surfaces (i.e., the principal surfaces) of the crystal element have an identical planar shape and an identical size. Moreover, defining the excitation electrode disposed on a positive Y'-surface as a first excitation electrode and the excitation electrode disposed on a negative Y'-surface as a second excitation electrode, the second excitation electrode is preferably disposed at a position meeting following relationships with respect to the first excitation electrode. (1) The first excitation electrode is moved along an X'-axis of the crystal by a distance dx given by T● tan α in a positive X'-direction (see FIG. 1A to FIG. 1C). (2) The first excitation electrode is moved along a Z'-axis of the crystal by a distance dy given by T● tan β in a negative Z'-direction (see FIG. 1A to FIG. 1C). (3) Then, the second excitation electrode is disposed at a position where a state moved in (1) and (2) is projected on the negative Y'-surface.

Here, T indicates a thickness of the crystal element. α and β are angles in the range predetermined according to the cut type of the crystal element (such as SC-cut and IT-cut). Moreover, a is the angle using the Z'-axis of the crystal element as the rotation axis (see FIG. 1B). B is the angle using the X'-axis of the crystal element as the rotation axis (see FIG. 1C). The following description assumes that the positive and the negative of the angles α and β on the respective positive Z'-surface and positive X'-surface of the crystal element and defines the counterclockwise as positive and the clockwise as negative (FIG. 1B and FIG. 1C). These positive and negative determine the displacing direction of the excitation electrodes on the front and the back surfaces. In the case where the crystal element is the doubly-rotated crystal resonator such as the SC-cut crystal element, the angles α and β are values different depending on the respective predetermined for each of the C mode and the B mode.

The above-described X'-axis and Z'-axis are the axes generated by the rotation from the X-axis and the Y-axis, the crystallographic axes of the crystal, by the cut angles φ and θ of this crystal element. That is, for example, with the crystal element that rotates only once like the AT-cut crystal element, the X'-axis and Z'-axis mean the axes formed after this one-time rotation. Alternatively, for example, with the crystal element that rotates twice by φ and θ like the SC-cut, the X'-axis and Z'-axis mean the axes formed after these twice rotations. Note that, the dash "'" does not mean the number of rotations. That is, like the AT-cut crystal element, the case where only the rotation around the X-axis is performed and the rotation around the Z-axis is not performed also attaches the dash sign "'" for indications of X', Y', and Z'. The doubly-rotated crystal element is also shown by attaching the one dash sign "'".

This disclosure is preferable to be applied to the flat plate crystal element, that is, the crystal element whose thickness is substantially uniform across the whole region. However, this disclosure is also applicable to the plano-convex crystal element. In the case where this disclosure is applied to the plano-convex crystal element, the thickness T of the crystal element configured to be the thickest portion in the thickness of this crystal element and the above-described conditions of (1), (2), and (3) are applied. In the case where this disclosure is applied to the plano-convex crystal element, compared with the application to the flat plate crystal element, an influence of the curved surface on the one surface of the crystal element occurs. However, since a curvature of this curved surface is substantially larger than the thickness T of the crystal element, the effects of this disclosure can be obtained even when the above-described conditions (1) to (3) are applied as it is. To embody this disclosure, any planar shape can be employed for the excitation electrode. However, the planar shape of the excitation electrode is preferably the elliptical shape. Moreover, it is preferable that the ellipse ratio of the ellipse electrode is designed to be within the predetermined range according to the cut type of the crystal element and the ellipse electrode is rotated in-plane within the predetermined range with respect to the crystal element. Note that, the ellipse in this preferable example includes, apparently a perfect ellipse with a sum of distances from two fixed points on one planar surface is fixed, an approximate ellipse exhibiting the effects equivalent to this disclosure even with the shape slightly deformed from the perfect ellipse. For example, even if slightly deformed from the perfect ellipse, as long as the long axis and the short axis are definable, the ellipse is included in the ellipse according to this disclosure.

To embody this disclosure, the inclined portion with the predetermined dimension (inclination width) where the thickness of this excitation electrode decreases heading for the end of this excitation electrode can be disposed at least at one edge portion on the excitation electrodes disposed on the front and the back surfaces of the crystal element.

With the crystal resonator according to the embodiments, the excitation electrodes on the front and the back surfaces are displaced by the predetermined relationships. This achieves the crystal resonator where the edges of the excitation electrodes on the front and the back surfaces vibrate in the identical displacement distribution. Therefore, compared with the case where the displacement distributions at the edges on the excitation electrodes on the front and the back surfaces differ, this easily reduces the unnecessary mode (spurious) at the edges. Accordingly, the loss during the vibration is less likely to occur. In other words, with the crystal resonator according to the embodiments, the excitation electrodes are disposed on the regions with the vibration displacement distribution (vibration energy) on the respective front and back surfaces of the crystal element with zero waste; therefore, the improvement is achieved in properties of the crystal resonator.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A crystal resonator that vibrates in a thickness-shear mode, the crystal resonator comprising:
   excitation electrodes, being disposed on a front surface and a back surface of a crystal element, wherein
   the excitation electrodes are disposed on the crystal element to have a positional relationship, where a displacement distribution at an edge of the excitation electrode on the front surface is identical to a displacement distribution at an edge of the excitation electrode on the back surface;
   wherein
   the crystal element has a thickness in a Y'-axis direction of a crystal,
   the crystal element having a principal surface on an X'-Z'-surface of the crystal,
   the excitation electrodes disposed on the front surface and the back surface of the crystal element have an identical planar shape and an identical size, and
   defining the excitation electrode disposed on a positive Y'-surface as a first excitation electrode and the excitation electrode disposed on a negative Y'-surface as a second excitation electrode, the second excitation electrode is disposed at a position meeting following relationships with respect to the first excitation electrode,
   (1) the first excitation electrode is moved along an X'-axis of the crystal by a distance dx given by T● tan α in a positive X'-direction,
   (2) the first excitation electrode is moved along a Z'-axis of the crystal by a distance dy given by T● tan β in a negative Z'-direction,
   (3) the second excitation electrode is disposed at a position where a state moved in (1) and (2) is projected on the negative Y'-surface,
   here, T indicates a thickness of the crystal element,
   α and β are angles predetermined according to a cut type of the crystal element, α is a rotation angle at a positive Z'-surface, β is a rotation angle at a positive X'-surface, and
   the X'-axis and the Z'-axis are axes generated by a rotation with respect to an X and a Y as crystallographic axes of the crystal by cut angles of the crystal element.

2. The crystal resonator According to claim 1, wherein the crystal element is an M-SC-cut crystal element, the α being α=25±5°, the β being β=0±5°.

3. The crystal resonator according to claim 1, wherein the crystal element is an SC-cut crystal element, the α being α=25±5°, the β being β=1±5°.

4. The crystal resonator according to claim 1, wherein the crystal element is an IT-cut crystal element, the α being α=24±5°, the β being β=2±5°.

5. The crystal resonator according to claim 1, where the crystal element is an AT-cut crystal element, the α being α=0±5°, the β being β=4±5°.

6. The crystal resonator according to claim 5, wherein the crystal element is a fifth harmonic AT-cut crystal element,
   the excitation electrodes on the front surface and the back surface have an elliptical planer shape and an ellipse ratio being 1.14%±10%.

7. The crystal resonator according to claim 1, wherein the excitation electrodes on the front surface and the back surface have an elliptical planar shape and an ellipse ratio which is predetermined, and
   the excitation electrodes are disposed on the crystal element at an in-plane rotation angle δ.

8. The crystal resonator according to claim 7, wherein the crystal element is an M-SC-cut crystal element, the α being α=25±5°, the β being β=0±5°, the ellipse ratio being 1.32±10%, the in-plane rotation angle δ being δ=−9±5°.

9. The crystal resonator according to claim 7, wherein the crystal element is an M-SC-cut crystal element, the α being α=25±5°, the β being β=0±5°, the ellipse ratio being 0.91±10%, the in-plane rotation angle δ being δ=−15±5°.

10. The crystal resonator according to claim 7, wherein the crystal element is an M-SC-cut crystal element, the α being α=25±5°, the β being β=0±5°, the ellipse ratio being 0.93±10%, the in-plane rotation angle δ being δ=−10±5°.

11. The crystal resonator according to claim 7, wherein the crystal element is an SC-cut crystal element, the α being α=25±5°, the β being β=1±5°, the ellipse ratio being 1.32±10%, the in-plane rotation angle δ being δ=−7±5°.

12. The crystal resonator according to claim 7, wherein the crystal element is an SC-cut crystal element, the α being α=25±5°, the β being β=1±5°, the ellipse ratio being 0.93±10%, the in-plane rotation angle δ being δ=−17±5°.

13. The crystal resonator according to claim 7, wherein the crystal element is an SC-cut crystal element, the α being α=25±5°, the β being β=1±5°, the ellipse ratio being 0.95±10%, the in-plane rotation angle δ being δ=−12±5°.

14. The crystal resonator according to claim 7, wherein the crystal element is an IT-cut crystal element, the α being α=24±5°, the β being β=2±5°, the ellipse ratio being 1.32±10%, the in-plane rotation angle δ being δ=−3±5°.

15. The crystal resonator according to claim 7, wherein the crystal element is an IT-cut crystal element, the α being α=24±5°, the β being β=2±5°, the ellipse ratio being 0.95±10%, the in-plane rotation angle δ being δ=−38±5°.

16. The crystal resonator according to claim 7, wherein the crystal element is an IT-cut crystal element, the α being α=24±5°, the β being β=2±5°, the ellipse ratio being 0.98±10%, the in-plane rotation angle δ being δ=−40±5°.

17. The crystal resonator according to claim 1, wherein the excitation electrode comprises:
 a main thickness portion, being formed to have a constant thickness; and
 an inclined portion, being formed at a peripheral area of the main thickness portion to have a thickness gradually decreasing from a part in contact with the main thickness portion to an outermost periphery of the excitation electrode,
 wherein the inclined portion has a width as an inclination width, having a length of 0.5 times or more to 3 times or less of a flexure wavelength,
 the flexure wavelength being a wavelength of a flexure vibration as an unnecessary vibration.

18. The crystal resonator according to claim 1, wherein the excitation electrode comprises:
 a main thickness portion, being formed to have a constant thickness; and
 an inclined portion, being formed at a peripheral area of the main thickness portion to have a thickness gradually decreasing from a part in contact with the main thickness portion to an outermost periphery of the excitation electrode,
 wherein the inclined portion has a width as an inclination width, having a length of 0.84 times or more to 1.37 times or less of a first flexure wavelength,
 the first flexure wavelength being a wavelength of a flexure vibration in a fundamental wave of a thickness-shear vibration,
 the inclination width having the length of 2.29 times or more to 3.71 times or less of a second flexure wavelength,
 the second flexure wavelength being a wavelength of the flexure vibration in a third harmonic of the thickness-shear vibration.

19. The crystal resonator according to claim 17, wherein the inclined portion is disposed only at the excitation electrode on a surface opposite to a frequency adjustment surface on the crystal resonator, among the excitation electrodes disposed on the front surface and the back surface of the crystal element.

20. The crystal resonator according to claim 19, wherein the excitation electrode on the frequency adjustment surface of the crystal resonator has a thickness thinner than a thickness of the main thickness portion at the excitation electrode on a surface opposite to the frequency adjustment surface.

21. The crystal resonator according to claim 17, wherein the crystal element has a flat plate shape.

\* \* \* \* \*